(12) United States Patent
Jerjian

(10) Patent No.: US 12,381,341 B2
(45) Date of Patent: Aug. 5, 2025

(54) PLANAR ELECTRICAL WIRING SYSTEM AND METHOD AND DISTRIBUTION SYSTEM

(71) Applicant: ACQUIRE INDUSTRIES LTD., Toronto (CA)

(72) Inventor: Edward Jerjian, Toronto (CA)

(73) Assignee: ACQUIRE INDUSTRIES LTD., Toronto (CA)

( * ) Notice: Subject to any disclaimer, the term of this patent is extended or adjusted under 35 U.S.C. 154(b) by 1101 days.

(21) Appl. No.: 17/057,840

(22) PCT Filed: May 22, 2019

(86) PCT No.: PCT/IB2019/054249
§ 371 (c)(1),
(2) Date: Nov. 23, 2020

(87) PCT Pub. No.: WO2019/224749
PCT Pub. Date: Nov. 28, 2019

(65) Prior Publication Data
US 2021/0210879 A1    Jul. 8, 2021

Related U.S. Application Data

(60) Provisional application No. 62/674,682, filed on May 22, 2018.

(51) Int. Cl.
*H01R 12/68* (2011.01)
*H01B 7/08* (2006.01)
(Continued)

(52) U.S. Cl.
CPC ........... *H01R 12/68* (2013.01); *H01B 7/0869* (2013.01); *H05B 3/06* (2013.01); *H05B 3/34* (2013.01);
(Continued)

(58) Field of Classification Search
CPC ........ H01R 12/68; H01R 12/616; H01B 3/06; H01B 3/34; H01B 3/36
See application file for complete search history.

(56) References Cited

U.S. PATENT DOCUMENTS 2,502,147 A * 3/1950 Grothouse ............ F24D 13/024
174/94 S
2,749,382 A * 6/1956 Lockard .................... H02G 3/00
174/117 FF
(Continued)

FOREIGN PATENT DOCUMENTS

CA      2879446 A1 *  2/2014  ....... B32B 17/10036
GB       357171 A  *  9/1931
(Continued)

OTHER PUBLICATIONS

Machine translation of WO-2005008686-A1, Dec. 2024 (Year: 2024).*

(Continued)

*Primary Examiner* — Geoffrey S Evans
(74) *Attorney, Agent, or Firm* — Harness, Dickey & Pierce, PLC

(57) ABSTRACT

A modular planar electrical wiring system for providing a planar electrical wiring according to a desired configuration includes a planar electrical distribution cable, at least one planar electrical appliance embedded in a planar sheet and connectable to the planar electrical distribution cable; and at least one planar connector for connecting a corresponding planar electrical appliance to the electrical distribution cable at any given location therealong according to the desired configuration, to thereby provide a modular planar electrical wiring system having a low height profile. There is also provided a modular power distribution system provided with a power source, an enclosure for a planar power distribution (Continued)

cable, a crimp connector including a control system, and power sources for a planar modular power distribution system.

22 Claims, 12 Drawing Sheets

(51) Int. Cl.
*H05B 3/06* (2006.01)
*H05B 3/34* (2006.01)
*H05B 3/36* (2006.01)
*H05K 7/00* (2006.01)
*H01R 4/24* (2018.01)
*H01R 12/61* (2011.01)

(52) U.S. Cl.
CPC ............... *H05B 3/36* (2013.01); *H05K 7/005* (2013.01); *H01R 4/24* (2013.01); *H01R 12/616* (2013.01); *H05B 2203/013* (2013.01); *H05B 2203/026* (2013.01); *H05B 2203/032* (2013.01)

(56) References Cited

U.S. PATENT DOCUMENTS

| | | | | |
|---|---|---|---|---|
| 3,068,376 | A | * | 12/1962 | Hammell ............... H05B 33/06 174/262 |
| 3,960,430 | A | | 6/1976 | Bunnel et al. |
| 4,065,199 | A | * | 12/1977 | Andre ...................... H01B 7/08 174/72 A |
| 8,575,523 | B2 | | 5/2013 | Chivers et al. |
| 8,487,186 | B2 | | 7/2013 | El-Fityani |
| 9,963,236 | B2 | | 5/2018 | Silva et al. |
| 2004/0026405 | A1 | * | 2/2004 | Alvite ..................... H05B 3/342 219/486 |
| 2004/0035853 | A1 | * | 2/2004 | Pais ......................... H05B 3/36 392/432 |
| 2004/0183375 | A1 | * | 9/2004 | Hayes ................. B60R 16/0207 307/10.1 |
| 2007/0152504 | A1 | * | 7/2007 | Hayes ................. B60R 16/0207 307/10.1 |
| 2007/0294818 | A1 | * | 12/2007 | Tei .......................... A61H 33/06 4/524 |
| 2009/0146179 | A1 | * | 6/2009 | Chen ............... H01L 31/035281 398/183 |
| 2015/0253000 | A1 | * | 9/2015 | Abernethy .............. F21L 14/02 362/249.06 |

FOREIGN PATENT DOCUMENTS

| | | | |
|---|---|---|---|
| GB | 2464533 A | | 4/2010 |
| JP | 2009259550 A | * | 11/2009 |
| WO | WO-2004/016045 | | 2/2004 |
| WO | WO-2005008686 A1 | * | 1/2005 ........... H01B 7/0838 |

OTHER PUBLICATIONS

Machine translation of CA-2879446-A1, Dec. 2024 (Year: 2024).*
International Search Report dated Sep. 16, 2019 in related PCT Application No. PCT/IB2019/054249.
Canadian Office Action in corresponding application No. 3,101,111 dated Nov. 28, 2023.

* cited by examiner

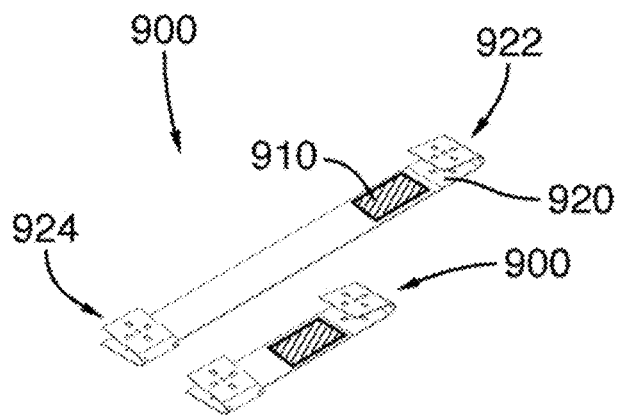
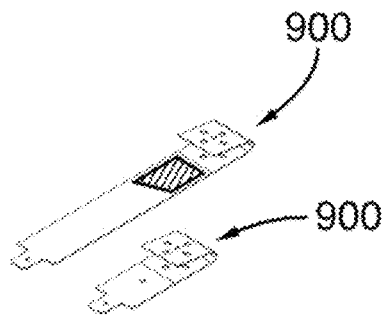
FIG.9A    FIG.9B
FIG.9C
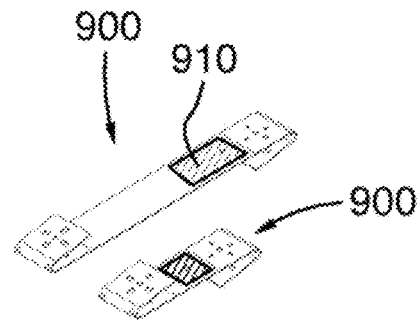
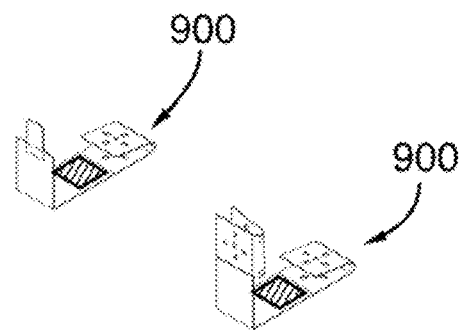
FIG.9D    FIG.9E

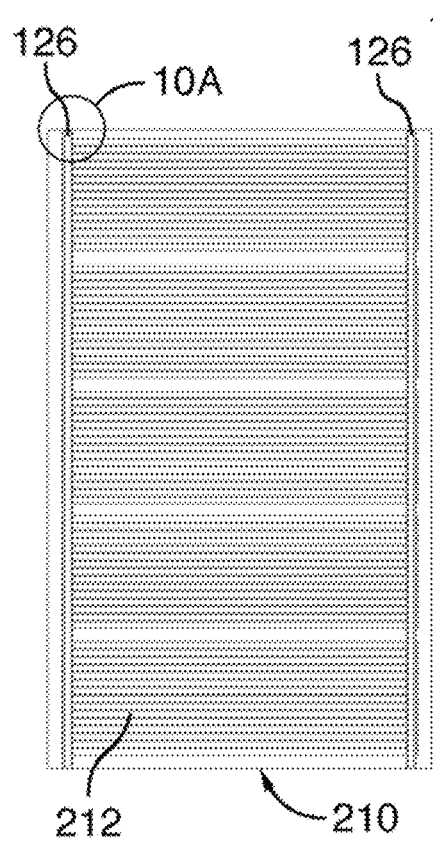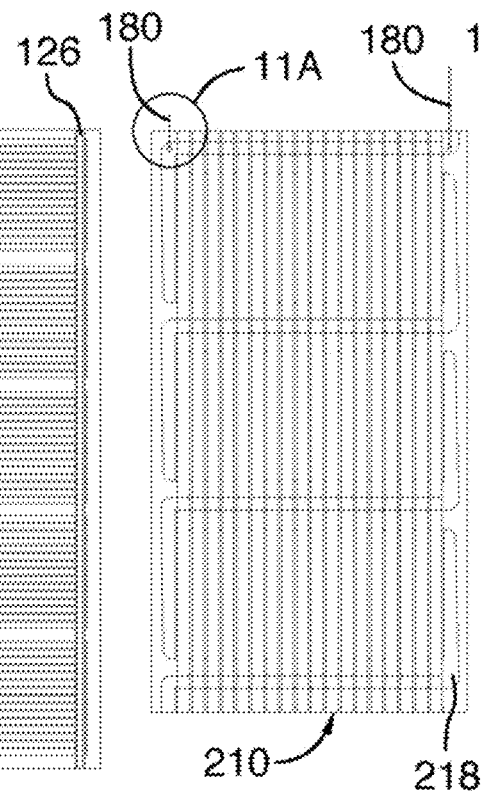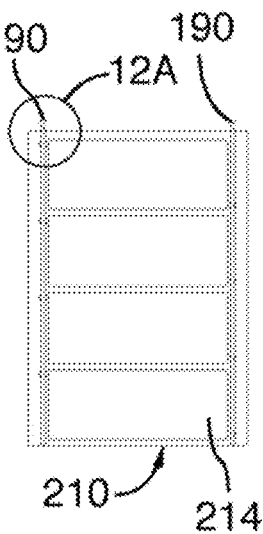
FIG.10  FIG.11  FIG.12
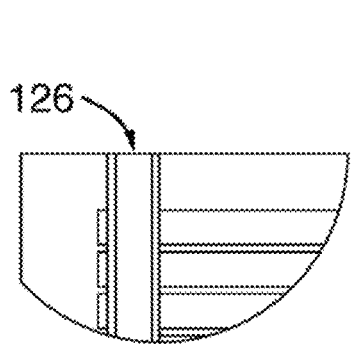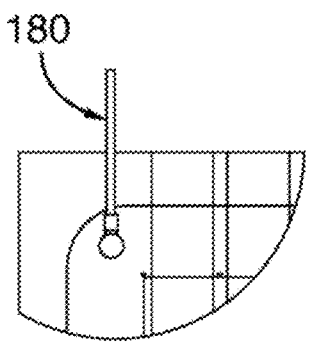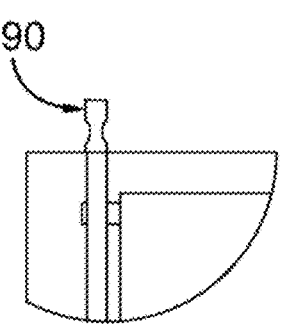
FIG.10A  FIG.11A  FIG.12A

PLANAR ELECTRICAL WIRING SYSTEM AND METHOD AND DISTRIBUTION SYSTEM

CROSS-REFERENCE TO RELATED APPLICATIONS

This application is a National Phase Entry of International Application Serial No. PCT/IB2019/054249, filed on May 22, 2019, which claims priority to U.S. Provisional Application No. 62/674,682, filed on May 22, 2018, both of which are incorporated by reference herein.

TECHNICAL FIELD

The present invention generally relates to electrical wiring systems and methods and more particularly relates to modular planar electrical wiring systems and methods for use with planar appliances.

BACKGROUND

In the 1970s, NASA engaged in spin-off development projects to apply aerospace technologies and systems to problems in the building industry. The earliest problem areas were electrical wiring for commercial and residential construction, and NASA's Flat Conductor Cable (FCC) offered an anticipated cost-effective and modular solution for baseboard and under-carpet cabling. FCC is a planar flexible composition of multiple copper ribbon conductors placed edge-to-edge and separated and enclosed within an insulating assembly. This insulating assembly is typically with primary insulation being hot-melted PET films and secondary insulation being a detachable PVC film layer.

In 1976, the National Electrical Code (NEC) committee approved FCC systems for use under carpet squares, which is currently the only approved application of planar electrical power distribution cables.

U.S. Pat. No. 3,960,430 describes a Flat Wiring System and Crimped Connection where branch circuit receptacles may be crimped directly to the FCC cable. Such prior art describes under carpet or baseboard systems and a means of a crimp connection for splicing or tapping to other sections of FCC. To date, these systems have not been approved for directly connecting electrical apparatus used for dedicated load, generation, and/or storage.

There is therefore a need for an improved electrical wiring system for use with electrical apparatus for dedicated load, generation, and/or storage, and more specifically planar appliances.

SUMMARY

According to a first aspect, there is provided a modular planar electrical wiring system for providing a planar electrical wiring according to a desired configuration. The electrical wiring system comprises a planar electrical distribution cable comprising a plurality of planar insulated conductors extending therealong and parallel to each other. The electrical wiring system has at least one planar electrical appliance embedded in a planar sheet and connectable to the planar electrical distribution cable. The electrical wiring system comprises at least one planar connector for connecting a corresponding planar electrical appliance to the electrical distribution cable at any given location therealong according to the desired configuration. The planar connector has a first end crimpable to the planar electrical distribution cable and a second end connectable to the planar electrical appliance, to thereby provide a modular planar electrical wiring system having a low height profile.

In one embodiment, the at least one planar electrical appliance comprises a planar heating panel.

In a further embodiment, the at least one planar electrical appliance comprises a plurality of planar heating panels, each being independently connectable to the planar cable in a parallel relationship.

In one embodiment, the at least one planar electrical appliance comprises a lighting panel.

In a further embodiment, the at least one planar electrical appliance comprises a planar electrical generation appliance.

In one embodiment, the planar power generation appliance comprises a solar photovoltaic panel.

In a further embodiment, the at least one planar electrical appliance comprises a planar power storage appliance.

In one embodiment, the at least one planar electrical appliance comprises at least one load appliance and an electrical generation appliance for supplying the at least one load appliance autonomously.

In one embodiment, the second end of the connector comprises a planar crimp portion adapted for crimping to a flat power connector of the electrical appliance.

In a further embodiment, the planar electrical wiring system further comprises a power source connectable to the planar electrical cable.

In a further embodiment, the power source comprises a hybrid AC and DC power source.

In one embodiment, the power source comprises an electrical generation appliance embedded in a planar sheet and comprising a planar power connector operatively connectable to the electrical power distribution cable.

In one embodiment, the power source further comprises a power line communication system for communicating with a control system of the at least one electrical appliance.

In one embodiment, the at least one planar connector for connecting a corresponding planar electrical appliance to the electrical distribution cable further comprises a control system adapted for communicating with the power source. The control system is embedded in a planar electronic board connected between the first and second end of the corresponding connector.

In one embodiment, the planar electrical wiring system further comprises at least one planar branch circuit connectable to the electrical distribution cable at any given location therealong according to the desired configuration through a set of planar connectors having a first and a second crimpable end. The at least one electrical appliance is operatively connectable to the planar electrical distribution cable through the at least one planar branch circuit.

According to a second aspect, there is provided a modular power distribution system comprising a planar main electrical cable comprising a plurality of planar insulated conductors extending therealong and parallel to each other. The modular power distribution system has a power source operatively connectable to the main electrical cable and at least one planar branch circuit connectable to the main electrical cable. The modular power distribution system comprises a set of planar connectors for connecting a corresponding planar branch circuit to the main electrical cable at any given location therealong according to a desired configuration. Each of the planar connectors has a first and a second end crimpable to the planar main electrical cable and to the corresponding planar branch circuit respectively. The modular power distribution system also comprises at least one planar appliance connector, each having a first end crimpable to one of the planar main electrical cable and the at least one planar branch circuit at any given location therealong, and a second end connectable to a planar electrical appliance embedded in a planar sheet.

In one embodiment, the power source comprises a DC power source. In a further embodiment, the power source comprises an AC power source, with or without a DC power source.

In still a further embodiment, the power source comprises a hybrid AC and DC power source.

In one embodiment, the power source comprises an electrical generation appliance embedded in a planar sheet and comprising a planar power connector connectable to one of the main electrical cable and the at least one planar branch circuit.

In one embodiment, the second end of the at least one planar appliance connector comprises a planar crimp portion adapted for crimping to a planar power connector of the electrical appliance.

In one embodiment, each of the at least one planar appliance connector further comprises a control system adapted for communicating with the power source, the control system being embedded in a planar electronic board connected between the first and second ends of the corresponding appliance connector.

In one embodiment, the power source further comprises a power line communication system for communicating with a control system of the at least one electrical appliance.

According to a third aspect, there is provided a power source for a planar modular power distribution system comprising a planar electrical generation appliance embedded in a planar sheet and operating on DC voltage. The power source comprises a hybrid source of AC/DC current comprising an inverter, the inverter being connected to the planar electrical generation appliance. The power source also comprises at least one of a source of AC current and a source of DC current. The power source has a planar modular power distribution circuit electrically connected to the hybrid source and to the at least one of the source of AC current and the source of DC current. The planar modular power distribution circuit is connectable at any given location therealong to at least one supplemental electrical appliance operating on one of DC and AC current.

In one embodiment, the power distribution circuit comprises at least one planar electrical cable having a plurality of planar insulated electrical conductors extending thereal-ong and parallel to each other.

In one embodiment, the power source further comprises a power line communication system for communicating with a control system of the at least one supplemental electrical appliance.

In one embodiment, the power source comprises a source of AC current, and wherein the power line communication system uses a modulated high frequency carrier signal propagated over the power distribution circuit at zero-crossings of a lower frequency AC.

In another embodiment, the power source comprises a source of DC current, and wherein the power line communication system uses a modulated high frequency carrier signal propagated over the power distribution circuit at zero-crossings of a pulse width modulated DC.

In another embodiment, the power source comprises a source of DC current, and wherein the power line communication system uses a digitally modulated high frequency carrier signal propagated over the power distribution circuit.

In another embodiment, the power line communication system uses a low voltage and high frequency unmodulated signal propagated over the power distribution circuit at zero-crossings.

In one embodiment, the carrier signal is modulated between 9 kHz to 30 MHz.

In one embodiment, the at least one supplemental electrical appliance comprises a plurality of electrical appliances. The power line communication system uses a plurality of corresponding signals for respectively communicating with a control system of the corresponding appliance, each of the signals being separated by at least 10 kHz.

In one embodiment, the at least one of a source of AC current and a source of DC current comprises a source of AC current operating at voltages and frequencies accommodating at least one branch circuit of the planar modular power distribution circuit connectable to the at least one supplemental electrical appliance.

In one embodiment, the power source further comprises at least one of a transformer and a frequency converter for supplying each of the at least one supplemental electrical appliance with adapted power.

In one embodiment, the at least one of a source of AC current and a source of DC current comprises a source of DC current operating at voltages accommodating at least one DC branch circuit of the planar modular power distribution circuit connectable to one of the at least one supplemental electrical appliance.

In a further embodiment, the power source further comprises at least one converter for supplying each of the at least one supplemental electrical appliance with adapted voltage.

According to a fourth aspect, there is provided a power source for a planar modular power distribution system comprising a modular planar power distribution circuit comprising a planar electrical cable having a plurality of planar insulated electrical conductors extending therealong and parallel to each other. The power distribution circuit is electrically connectable at any given location therealong to at least one planar electrical appliance provided with a control system. The power source comprises a power line communication system using a signal propagated over the planar electrical cable at zero-crossings for communicating with the control system of the appliance.

In one embodiment, the power source further comprises a source of AC current. The power line communication system uses a modulated high frequency carrier signal propagated over the power distribution circuit at zero-crossings of a lower frequency AC.

In one embodiment, the power source further comprises a source of DC current. The power line communication system uses a modulated high frequency carrier signal propagated over the power distribution circuit at zero-crossings of a pulse width modulated DC.

In one embodiment, the power source comprises a source of DC current. The power line communication system uses a digitally modulated high frequency carrier signal propagated over the power distribution circuit.

In another embodiment, the power line communication system uses a low voltage and high frequency unmodulated signal propagated over the power distribution circuit at zero-crossings.

In one embodiment, the power line communication system is one-way.

In another embodiment, the power line communication system is two-way and enables to control and monitoring operation of the electrical appliance through the control system thereof.

In one embodiment, the carrier signal is modulated between 9 kHz to 30 MHz.

In one embodiment, the at least one appliance comprises a plurality of electrical appliances. The power line communication system uses a plurality of corresponding signals for respectively communicating with the control system of the corresponding appliance, each of the signals being separated by at least 10 kHz.

In one embodiment, the signal is propagated along a power electrical conductor of the electrical cable.

In one embodiment, the signal is propagated along a neutral electrical conductor of the electrical cable.

In one embodiment, the signal is propagated along a dedicated electrical conductor of the electrical cable.

In one embodiment, the power source further comprises a wave filter connected in series with the electrical conductors of the planar electrical cable for preventing high frequency carrier waves from leaving the power source.

In one embodiment, the electrical appliance is embedded in a planar sheet.

According to a fifth aspect, there is provided an enclosure for a planar power distribution cable having a primary insulation. The enclosure comprises a planar cable jacket for enclosing the planar power distribution cable. The jacket comprises a dielectric insulation layer extending along the cable and mounted on an upper portion of the primary insulation of the cable. The jacket also comprises an upper inner conductive covering extending along the cable and mounted on the dielectric insulation layer. The jacket also comprises a metal foil ribbon extending along the cable, the metal foil ribbon being disposed on the upper inner conductive covering. The jacket further comprises an upper and a lower outer protective layer detachably attached together along side edges thereof; the upper and lower outer protective layers enclosing the cable, the dielectric insulation layer, the upper inner conductive covering and the metal foil ribbon together.

In one embodiment, the upper inner conductive covering comprises a planar metal shield.

In one embodiment, the planar power distribution cable comprises a plurality of planar insulated conductors extending therealong and parallel to each other.

In one embodiment, the upper inner conductive covering covers over about 80% of a central longitudinal region of the planar power distribution cable with openings not more than 1 mm in diameter.

According to a sixth aspect, there is provided a planar crimp connector for connecting a planar electrical appliance to a planar power distribution cable. The crimp connector comprises a first end provided with an insulation-piercing crimp connection for connecting at any given location along the power distribution cable according to a desired configuration; and a second end for connection to the planar electrical appliance. The crimp connector has a control system adapted for communicating with a power source connected to the planar power distribution cable. The control system is embedded in a planar electronic board connected between the first and second end of the planar crimp connector.

In one embodiment, the control system comprises a relay for switching the electrical appliance.

In one embodiment, the control system is one-way. In an alternative embodiment, the control system is two-way and enables to control and monitoring operation of the electrical appliance.

In one embodiment, the planar electrical appliance is embedded in a planar sheet.

In one embodiment, the second end of the crimp connector comprises a foil connector for connection to a planar conductor of the planar electrical appliance.

In a further embodiment, the foil connector is crimped on one side of the planar conductor of the planar electrical appliance. In still a further embodiment, the foil connector is crimped on both sides of the planar conductor of the planar electrical appliance.

In another embodiment, the second end of the crimp connector comprises a barrel connector. In still another embodiment, the second end of the crimp connector comprises a tab connector.

According to a seventh aspect, there is provided a planar electrical wiring method for providing a planar electrical wiring according to a desired configuration. The method comprises: providing a planar electrical distribution cable comprising a plurality of planar insulated conductors extending therealong and parallel to each other; installing the electrical distribution cable according to the desired configuration on a supporting surface; and connecting at least one planar electrical appliance embedded in a planar sheet to the planar electrical distribution cable at any given location therealong according to the desired configuration through at least one corresponding planar connector having a first end crimpable to the planar cable and a second end connectable to the appliance, to thereby provide a modular planar electrical wiring having a low height profile.

In one embodiment, the planar electrical wiring method further comprises operatively connecting a power source to the electrical distribution cable.

In one embodiment, the planar electrical wiring method further comprises establishing communication between the power source and the electrical appliance for controlling operation thereof, the communication being performed using a signal propagated along the planar electrical distribution cable.

In a further embodiment, the establishing communication comprises establishing a two-way communication for monitoring the electrical appliance.

In one embodiment, the connecting at least one planar electrical appliance comprises connecting at least one load appliance and an electrical generation appliance to the planar electrical distribution cable for supplying the at least one load appliance autonomously.

In one embodiment, the planar electrical wiring method further comprises: connecting at least one planar branch circuit to the electrical distribution cable at any given location therealong according to the desired configuration through at least one corresponding planar branch connector having a first and a second end respectively crimpable to the electrical distribution cable and the planar branch circuit; and connecting at least one additional planar electrical appliance embedded in a planar sheet to the at least one planar branch circuit at any given location therealong according to the desired configuration through at least one corresponding planar connector having a first end crimpable to the planar branch circuit and a second end connectable to the appliance.

BRIEF DESCRIPTION OF THE DRAWINGS

In order that the invention may be readily understood, embodiments of the invention are illustrated by way of example in the accompanying drawings.

FIG. 7A is a top perspective view of a planar power distribution cable, according to one embodiment, while

FIG. 9A is a perspective top view of two planar crimp connectors for connecting a planar electrical appliance to a planar power distribution cable, according to one embodiment;

FIG. 9B is a perspective top view of two planar crimp connectors for connecting a planar electrical appliance to a planar power distribution cable, according to another embodiment;

FIG. 9C is a perspective top view of a planar crimp connector for connecting a planar electrical appliance to a planar power distribution cable, according to another embodiment;

FIG. 9D is a perspective top view of two planar crimp connectors for connecting a planar electrical appliance to a planar power distribution cable, according to another embodiment;

FIG. 9E is a perspective top view of two planar crimp connectors for connecting a planar electrical appliance to a planar power distribution cable, according to another embodiment;

FIG. 10 is a top view of a planar heating panel, according to one embodiment; while FIG. 10A is an enlarged view of portion A of FIG. 10;

FIG. 11 is a top view of an electrical generation apparatus, according to one embodiment; while FIG. 11A is an enlarged view of portion A of FIG. 11;

FIG. 12 is a top view of a lighting panel, according to one embodiment;

while FIG. 12A is an enlarged view of portion A of FIG. 12;

Figure 1:
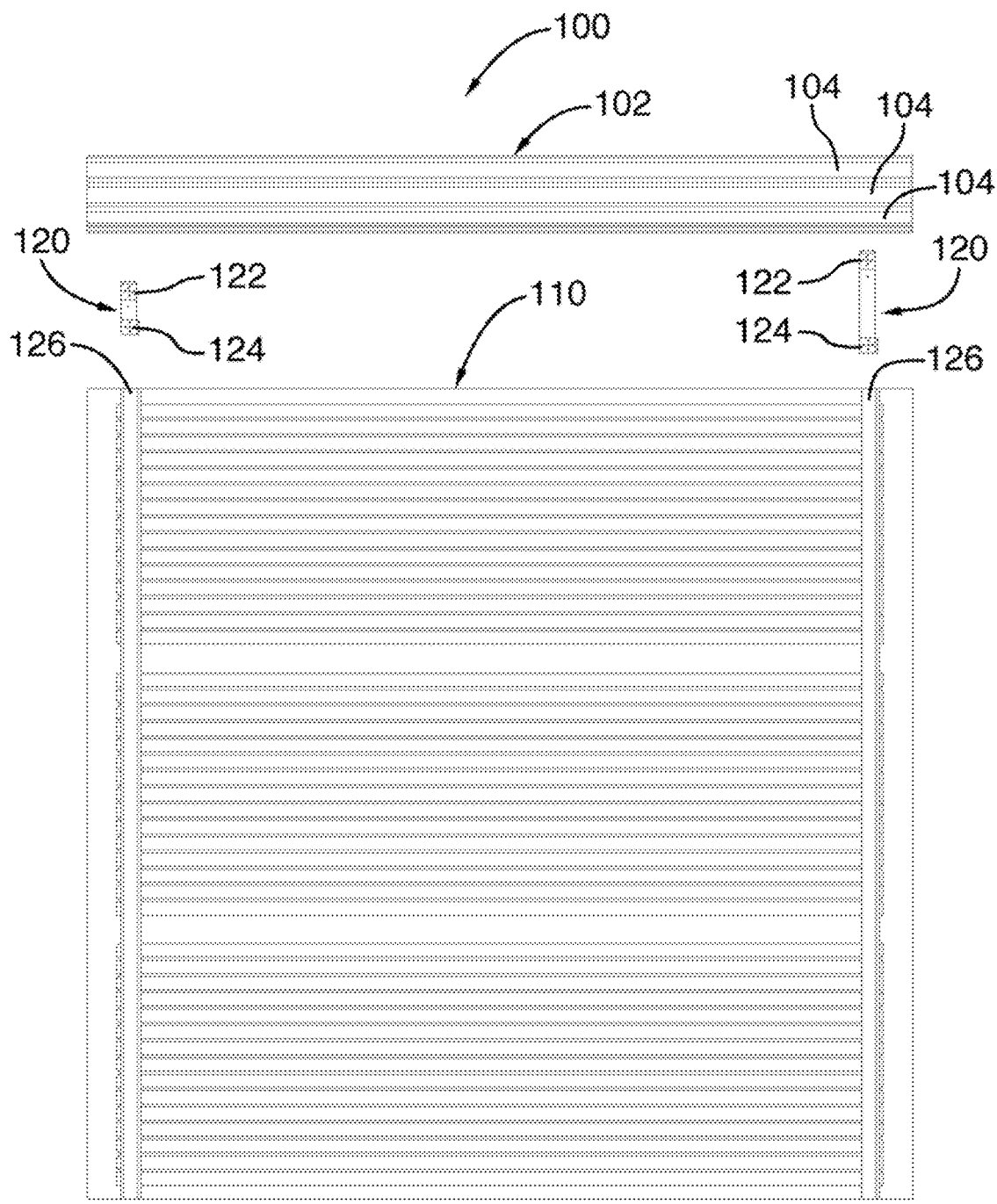
FIG. 1 is a top schematic view of a modular planar electrical wiring system for providing a planar electrical wiring according to a desired configuration, according to one embodiment.

Further details of the invention and its advantages will be apparent from the detailed description included below.

DETAILED DESCRIPTION

In the following description of the embodiments, references to the accompanying drawings are by way of illustration of examples by which the invention may be practiced. It will be understood that other embodiments may be made without departing from the scope of the invention disclosed.

Preferred embodiments of the present invention can be implemented in numerous configurations depending on implementation choices based upon the principles described herein. Various specific aspects are disclosed, which are illustrative embodiments not to be construed as limiting the scope of the disclosure. Although the present specification describes components and functions implemented in the embodiments with reference to standards and protocols known to a person skilled in the art, the present disclosures as well as the embodiments of the present invention are not limited to any specific standard or protocol.

Advances in materials science and nanotechnology are leading to new forms of technologies relating to compact devices embedded in thin sheet or film. For example, in PCT application having publication number WO2019/079893, the Applicant of the present invention proposes electrical heating elements using such technology.

Typically, large surface area heating elements may be manufactured with thin profiles or as free-form objects and using materials that may be flexible or substantially rigid and intended to replace electric heat trace cable and applications thereof. These heating elements may be manufactured in large-scale, for instance in rolls and/or sheets or films. For example, electrically resistive carbon nanotube (CNT) ink materials may be used to print large-surface area resistive heating films that can be manufactured roll-to-roll. In other example, high electrical conductivity copper or silver inks materials may be used to print inductive heating films that can be manufactured in sheets.

These electrical heating elements may provide increased versatility and allow for use in various applications, for fixed-location installations or as portable appliances. For example, these electric heating elements may be integrated into heating assemblies in industries such as construction, transportation, and consumer appliances. Some applications include over/under floor coverings, over/under pavements, over/under roofing, in-ceilings, in vertical walls, around pipes and vessels, in/over/around equipment or containers, in/over/under transportation vehicles or trailers, and for personal heating such as mats, blankets and clothing for non-limitative examples.

New similar technologies also recently allow for lighting, electrical generation and storage solutions embedded in thin sheets or rolls. Such new solutions may be particularly interesting in providing smart solutions, including heating solutions. For example, it could be envisaged to use various heating, and/or generation and/or storage thin devices in combination to provide a complete heating system, for example for a house.

Today, most of these devices and systems generally still tend to be highly customized to the particular implementation. Moreover, electrical wiring methods typically employ round wire or cable, often thicker in diameter than the planar electrical apparatus. Round wires and cables may be bundled together and routed around tight spaces and construction elements that make for a bulky, messy and time-consuming assembly that is known to cause difficulties when trying to identify points of failure or for inspection.

As it would become apparent upon reading of the present description, according to a first aspect of the invention, there is provided a modular planar electrical wiring system devised to reduce at least one of the above-mentioned drawbacks. The planar electrical wiring system would offer a lower profile within tight spaces and improved construction assembly. The planar electrical wiring system may be used in a great variety of application, including those using various appliances embedded in thin films or flexible sheets, as detailed below.

Referring to FIG. 1, there is shown a modular planar electrical wiring system 100 for providing a planar electrical wiring according to a desired configuration, according to one embodiment of the first aspect of the invention. The electrical wiring system 100 has a planar electrical distribution cable 102 comprising three planar insulated conductors 104 extending therealong and parallel to each other. In the illustrated embodiment, the planar insulated conductors 104 extend side by side but it could be envisaged to provide the conductors 104 stacked above each other for a given application. The electrical wiring system 100 also comprises a planar electrical appliance 110 embedded in a planar sheet and connectable to the planar electrical distribution cable 102. The planar electrical appliance 110 may be anyone of a planar heating panel, a lighting panel, a planar electrical generation appliance such as a solar photovoltaic panel or a planar power storage appliance, as described in more details below. The electrical wiring system 100 also comprises a first and a second planar connectors 120 for connecting a corresponding planar electrical appliance 110 to the electrical distribution cable 102 at any given location therealong according to the desired configuration, as it would become apparent below. Each of the planar connectors 120 is provided with a first end 122 crimpable to the planar electrical distribution cable 102 and a second end 124 connectable to the planar electrical appliance 110. In the illustrated embodiment, both ends 122, 124 of the planar connectors 120 are provided with crimp connexion for further crimping to a planar power connector 126 of the electrical appliance 110, but other embodiments may also be used, as further detailed below.

Throughout the present description, a crimp connexion or a crimp refers to any solderless connection by means of compressing and reshaping the termination until it is cold-welded onto a conductor. This may be performed using a crimping tool or screw-type termination that compresses the crimp connecting end portion(s) against each other or against a flat surface, such as a plate for example. Typically, these connectors are provided with insulation piercing using sharp ridges. In some embodiments, these types of connectors may be fastened in place within an injection molded cavity that also insulates the screw-type terminations that compress the crimp connector at the side edges against that rigid surface or onto each other, as known to the skilled addressee. It is worth mentioning that any functional mechanical equivalent enabling to provide a strong mechanical and electrical connexion could be considered, as it will become apparent below to the skilled addressee.

The use of flat conductors associated with planar connectors crimpable thereto enables to provide a modular planar electrical wiring system having a low height profile. Moreover, the use of planar conductors provided along the length of a planar electrical distribution cable associated with crimp connectors connectable anywhere along the length of the electrical distribution cable enables to configure the electrical wiring system in a modular manner according to a specific disposition with a great scalability. Installation, or construction may be more intuitive and performed in a fraction of the time it takes to wire using other known methods. This can result in a complete parallel branch circuit topology with localized nodes that make it easier to inspect and repair.

Figure 2:
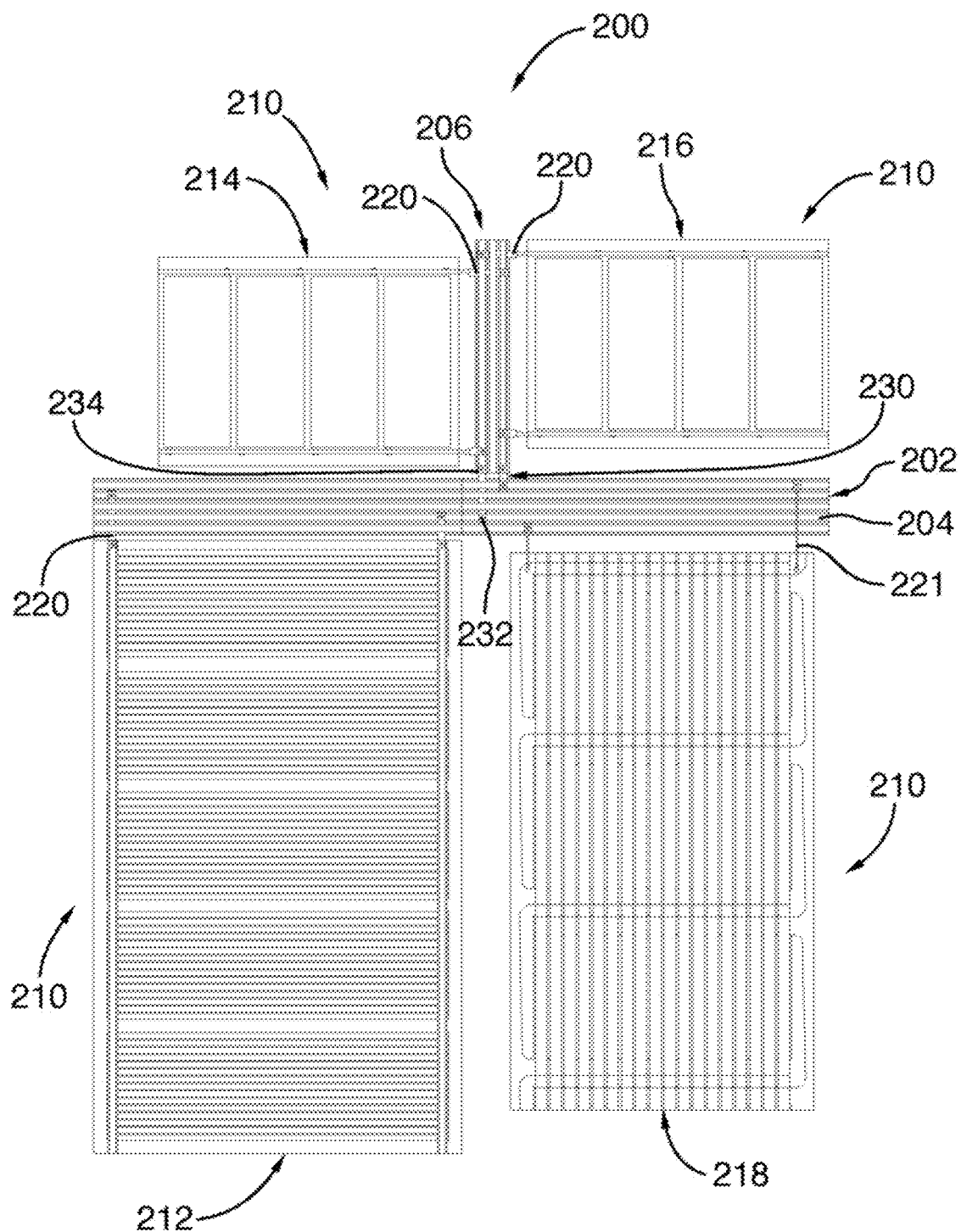
FIG. 2 is a top schematic view of another modular planar electrical wiring system for providing a planar electrical wiring according to a desired configuration, according to another embodiment.

Reference is now made to FIG. 2 which shows another modular planar electrical wiring system 200, according to another embodiment. In this embodiment, the planar electrical distribution cable 202 is provided with five planar insulated conductors 204 for providing a respective adapted power to the appliances 210 connected thereto. The electrical wiring system 200 has a planar branch circuit 206 connected to the electrical distribution cable 202 anywhere therealong, according to the desired configuration, through a set of planar connectors 230 having a first and a second crimpable end 232, 234.

In this embodiment, four electrical appliances 210 are electrically connected to the planar electrical distribution cable 202. Appliance 212 is an electrical load apparatus such as a planar heating panel directly connected to two conductors 204 of the electrical distribution cable 202 through two crimp connectors 220 similar to the crimp connectors 120 of FIG. 1. Appliances 214 and 216 are also electrical load apparatuses, for example of the lighting type. Appliances 214 and 216 are connected to the planar branch circuit 206 through crimp connectors 220. An appliance 218 is connected to two conductors 204 of the electrical distribution 202 cable through crimp connectors 221, as more detailed below with reference to FIG. 11. In the illustrated example, the appliance 218 is a planar electrical generation apparatus, a photovoltaic for example. As it can be seen, in this illustrated planar electrical wiring system 200, the appliance 218 is used to electrically supply the appliances 214, 216 electrically connected thereto through the branch circuit 206 connected to the corresponding conductors 204 of the electrical distribution cable 202. Such embodiment is of great advantage since it can provide an autonomous electrical wiring system 200 with a combined integrated power source.

In one embodiment, the modular planar electrical wiring systems 100, 200 may be provided with a power source (not shown) connectable to the electrical distribution cable 102, 202. As it should be appreciated, in one embodiment, the number of conductors 104, 204 and the power source should be adapted to provide the various AC and/or DC voltages required by a complete application through the corresponding conductors 104, 204.

Figure 3A:
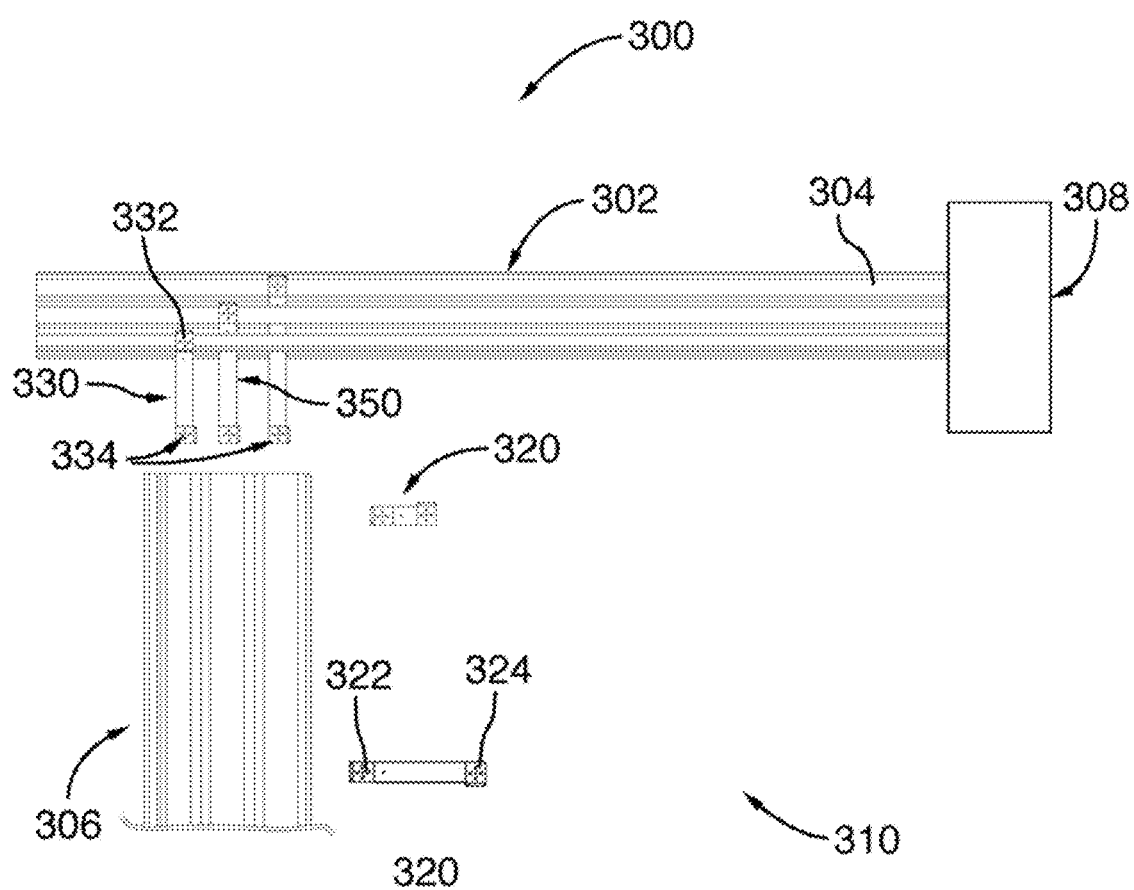
FIG. 3A is a top schematic view of a modular power distribution system, according to one embodiment.

Referring now to FIG. 3A, there is shown a modular power distribution system 300, according to an embodiment of the second aspect of the present invention. The modular power distribution system 300 comprises a planar main electrical cable 302 comprising three planar insulated conductors 304 extending therealong and parallel to each other and a power source 308 operatively connectable to the main electrical cable 302. The power source 308 may have an AC power source or a DC power source, or both, depending on a given application, as it will become apparent upon reading of the present description. In another embodiment, the power source 308 has a hybrid AC and DC power source. In a further embodiment, the power source 308 has one or several electrical generation appliances (not shown) embedded in a corresponding planar sheet and provided with a planar power connector electrically connectable to the main electrical cable 302, as shown in FIG. 2, either directly, either through a planar branch circuit 306 described below.

The modular power distribution system 300 also has a planar branch circuit 306 connectable to the main electrical cable 302 and a set of three planar connectors 330 for connecting the branch circuit 306 to the main electrical cable 302 at any given location therealong according to a desired configuration. Each of the planar connectors 330 has a first and a second end 332, 334 crimpable to the planar main electrical cable 302 and to the corresponding planar branch circuit 306 respectively. The modular power distribution system 300 also has two planar appliance connectors 320, each having a first end 322 crimpable to one of the planar main electrical cable 302 and the planar branch circuit 306 at any given location therealong, and a second end 324 connectable to a planar electrical appliance 310 embedded in a planar sheet. Several planar branch circuits 306 may be connected at various given locations along the main electrical cable 302, as it should be apparent. Moreover, several electrical appliances 310 may be connected to any of the branch circuit 306 and the main electrical cable 302.

Figure 3B:
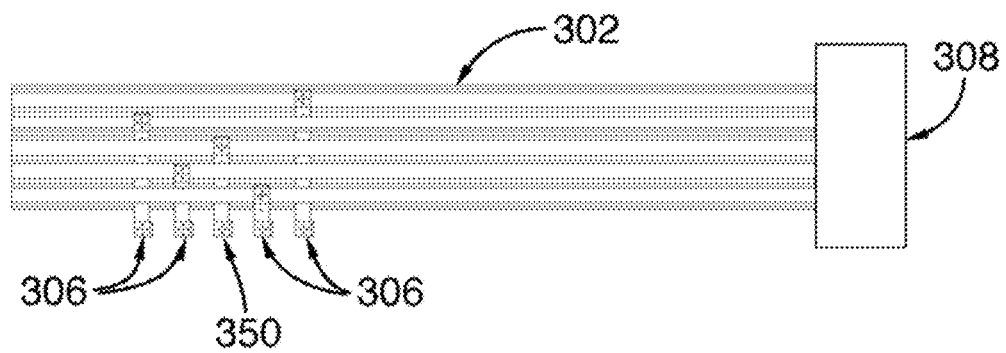
FIG. 3B is a top schematic view of a modular power distribution system, according to another embodiment.
Figure 3C:
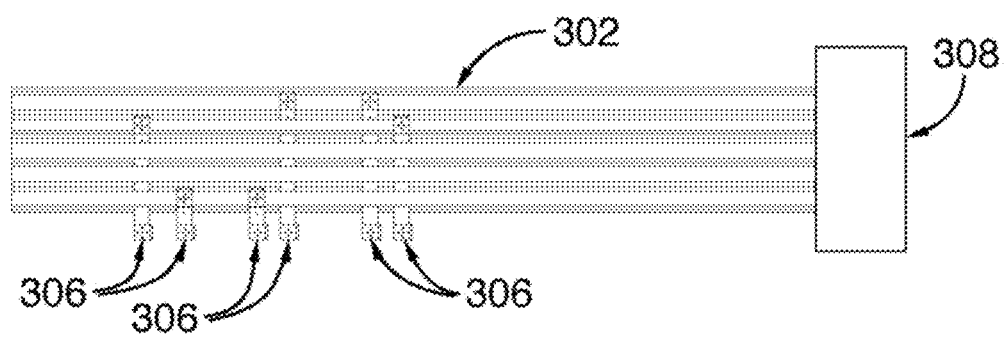
FIG. 3C is a top schematic view of a modular power distribution system, according to another embodiment.
Figure 3D:
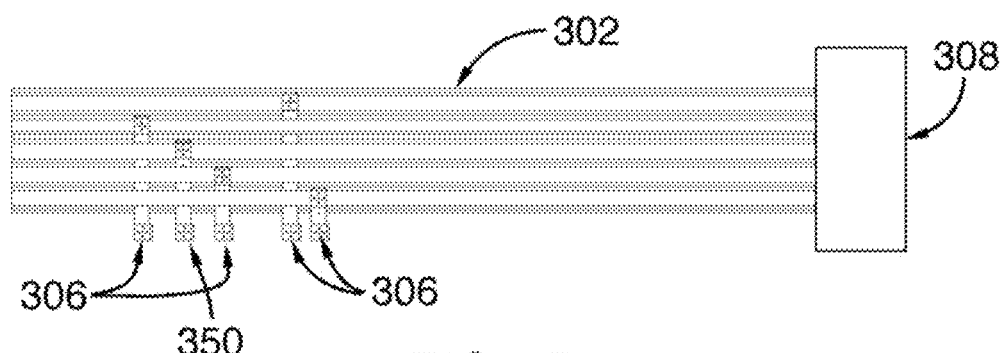
FIG. 3D is a top schematic view of a modular power distribution system, according to another embodiment.

FIG. 3B to 3D illustrate various other arrangements of a modular power distribution system 300 that can be implemented. It should be appreciated that these arrangements are described for exemplary purposes only and are not intended to limit the configurations that can be provided by such embodiments. On the contrary, each illustrated embodiment may be partially or wholly combined to provide a modular power distribution system 300 satisfying the requirements of a specific electrical installation.

In FIG. 3A, as described above, the main electrical cable 302 comprises a 3-conductor planar cable which may accommodate an AC branch circuit 306 or a DC branch circuit 306 with or without additional ground 350.

In FIG. 3B, the main electrical cable 302 comprises a 5-conductor planar cable which can accommodate two AC or two DC branch circuits 306 for example, with or without ground 350.

In FIG. 3C, the main electrical cable 302 comprises a 5-conductor planar cable which can accommodate three AC branch circuits 306 in a 3-phase arrangement without additional ground (not shown).

In FIG. 3D, the main electrical cable 302 comprises a 5-conductor planar cable that can be arranged with dual branch circuits 306 for both 3-conductor AC and 2-conductor DC with or without additional ground 350. This dual arrangement may be preferred when a planar electrical load apparatus operating on AC is crimp connected to the same planar power distribution cable also crimp connected to a DC planar electrical generation apparatus or plurality of apparatuses.

Figure 4:
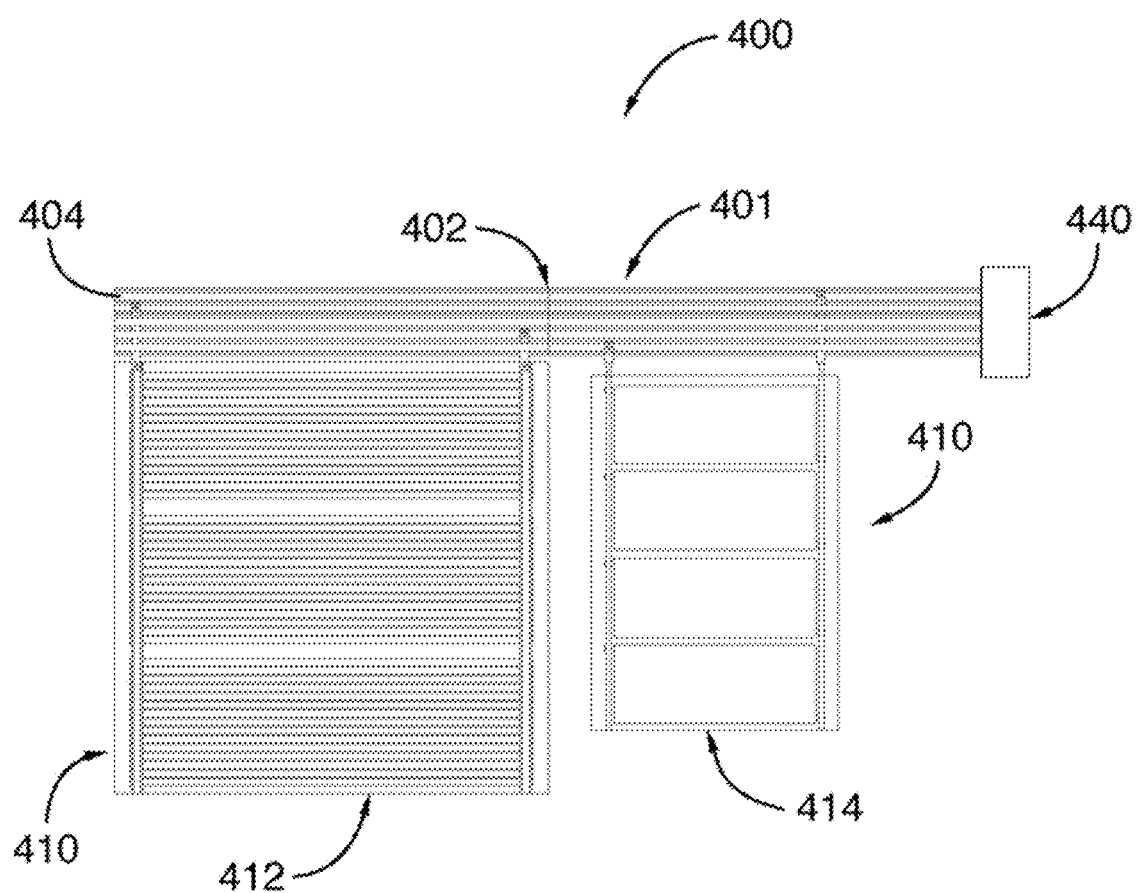
FIG. 4 is a top schematic view of a power source for a planar modular power distribution system, according to one embodiment.
Figure 5:
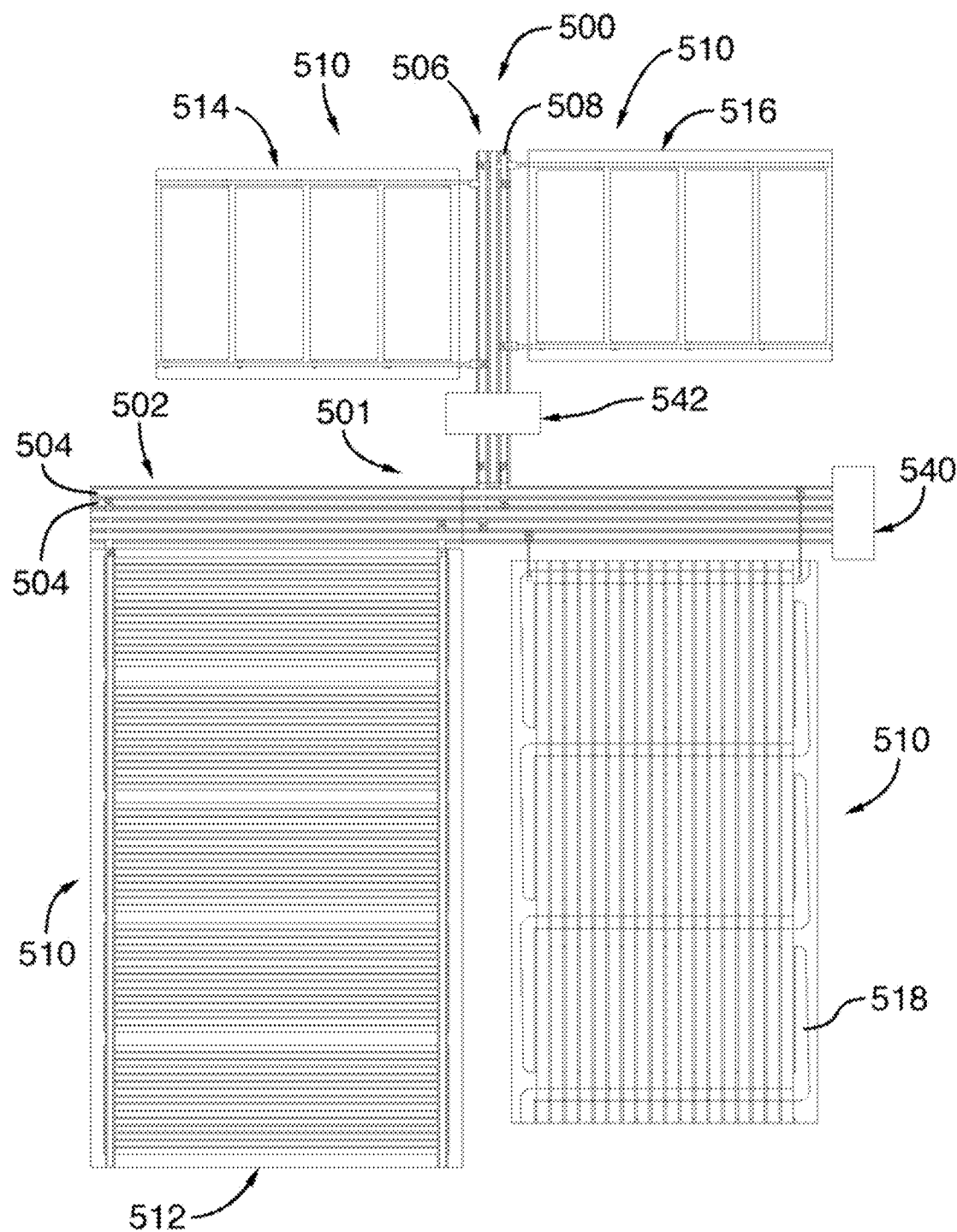
FIG. 5 is a top schematic view of another power source for a planar modular power distribution system, according to another embodiment.
Figure 6:
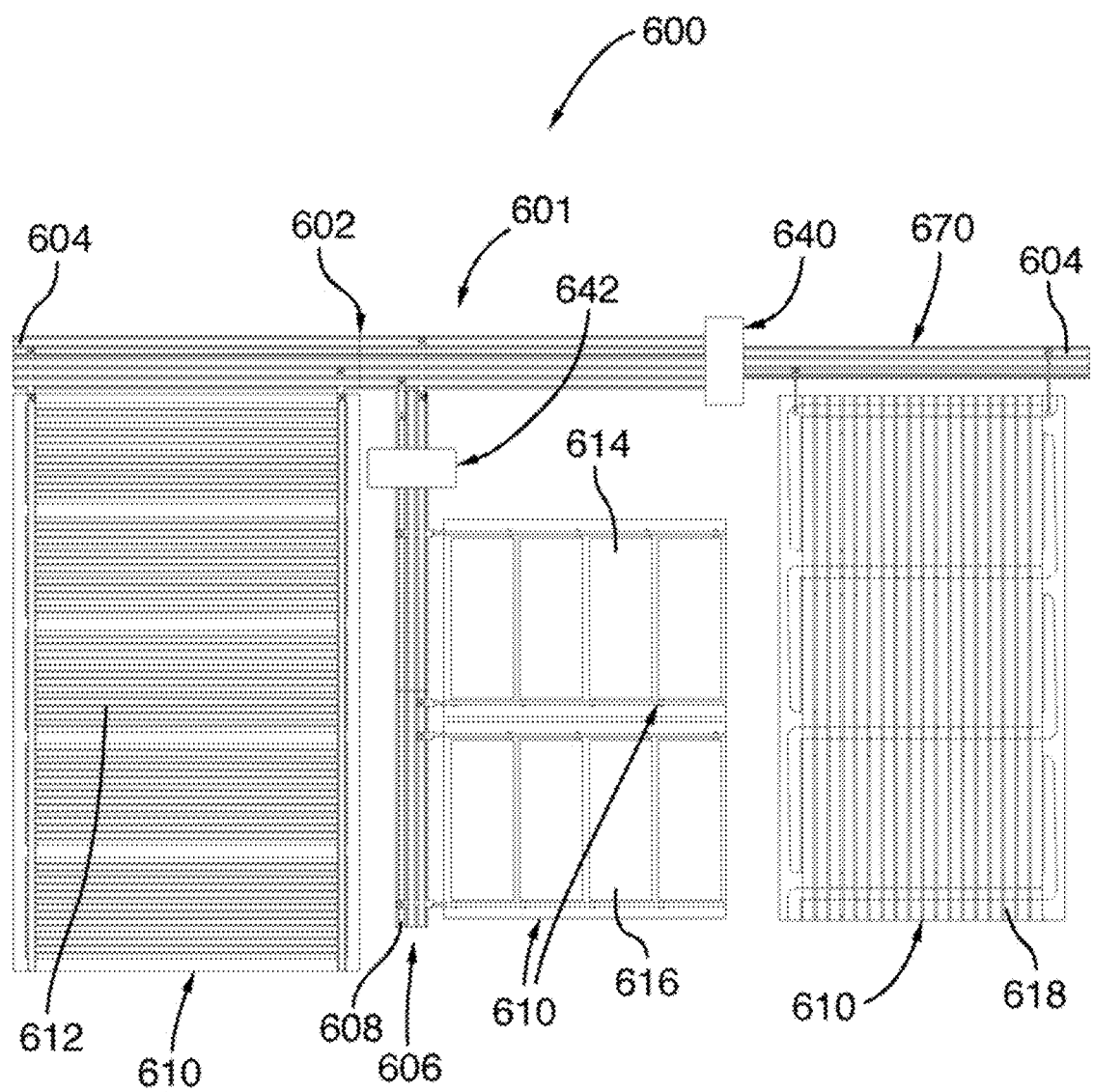
FIG. 6 is a top schematic view of another power source for a planar modular power distribution system, according to another embodiment.

Referring now to FIG. 4 to FIG. 6, various embodiments of a power source for a planar modular power distribution system will now be described as non-limitative examples, according to the third aspect of the invention.

In the embodiment illustrated in FIG. 4, the power source 400 has a planar modular power distribution circuit 401 comprising a planar power distribution cable 402 provided with five planar insulated conductors 404 extending therealong and parallel to each other. The power source 400 has an AC power source 440 that can be crimp connected to the 5-conductor planar power distribution cable 402. The power distribution cable 402 is crimp connected at any given location therealong according to a given configuration to two load apparatuses or appliances 410 that may operate at the same or different voltages and/or frequencies. A planar electrically resistive load apparatus 412 used for heating purposes and having 2-phase 240VAC at 60 Hz is crimp connected to corresponding conductors 404 of the power distribution cable 402 while a planar electroluminescent load apparatus 414 using 24VAC at 1.2 kHz may be crimp connected to other corresponding conductors 404.

As it should be apparent to the skilled addressee, depending on a particular application, the power source 440 may comprise a plurality of power sources such as one or more transformers or one or more frequency converters, according to the needs, for supplying each of the electrical appliances with adapted voltage. The skilled addressee will also appreciate that the power source 440 used and each conductor 404 of the 5-conductor planar power distribution cable 402 connected thereto should be adapted to the maximum current capacity defined by the appliances 410 connected thereto.

In a further embodiment, the power source 440 may also comprise a planar electrical generation appliance (not illustrated) embedded in a planar sheet and operating on DC voltage that is electrically connected to the power distribution cable 402. In still a further embodiment, the power source 440 may also comprise a hybrid source of AC/DC current (not shown) provided with an inverter, the inverter being connected to the planar electrical generation appliance, as further detailed with reference to FIGS. 5 and 6.

Referring now to FIG. 5, there is shown another power source 500 for a planar modular power distribution system, according to another embodiment. In this embodiment, the power source 500 has a DC power source 540 that can be crimp connected to a 5-conductor planar power distribution cable 502 of a planar modular power distribution circuit 501. The power source 500 also has a separate power source 542 crimp connected to corresponding conductors 504 of the power distribution cable 502 anywhere therealong for defining a branch circuit 506 having two conductors 508. The power distribution cable 502 and the branch circuit 506 are crimp connected at any given location therealong according to a given configuration to various load apparatuses or appliances 510 that may operate at the same or different voltages. In the illustrated embodiment, a planar electrically resistive load apparatus 24 VDC 512 used for heating purposes and having a single phase is crimp connected to corresponding conductors 504 of the power distribution cable 502. Two planar electroluminescent load apparatuses 514, 516 both working at 24VAC at 1.2 kHz are each crimp connected to the same corresponding conductors 508 of the branch circuit 506. A planar electrical photovoltaic generation apparatus 518 working at 36 VDC is crimp connected to other corresponding conductors 504 of the power distribution cable 502.

As it should now be apparent, the power source 540, 542 may comprise a plurality of power sources such as a DC/DC and/or frequency converter, or a separate power source crimp connected to corresponding conductors 504 with crimp connection to support another power distribution system.

Referring now to FIG. 6, there is shown another power source 600 for a planar modular power distribution system, according to another embodiment. In this embodiment, the power source 600 has an AC/DC hybrid power source 640 that may be crimp connected to a plurality of branch circuits operating at AC and/or DC voltages. A planar electrically resistive load apparatus 612 working at 240VAC at 60 Hz may be crimp connected to corresponding conductors 604 supplied with adapted AC voltage provided by the power source 640. Two planar electroluminescent load apparatuses 614, 616 both working at 24VAC at 1.2 kHz are each crimp connected to the same corresponding conductors 608 of the branch circuit 606. A planar electrical photovoltaic generation apparatus 618 working at 24 VDC is crimp connected to other corresponding conductors 604 of the power distribution circuit 601.

In this embodiment, the power source 640 may have a DC/AC inverter that may be crimp connected to both a 5-conductor power distribution cable 602 and a 3-conductor power distribution cable 670 with two load branch circuits operating on AC and DC, and another DC branch circuit for power generation. Depending on the specific needs of a particular application, the power source 640 may comprise a plurality of power sources such as a DC/AC inverter, a DC/DC converter and/or a frequency converter, or even a separate power source 642 crimp connected to corresponding conductors 604 for defining the branch circuit 606 to support another power distribution system, as it should now be apparent to the skilled addressee.

Referring again to FIG. 4 to FIG. 6, another power source for a planar modular power distribution system will now be described, according to the fourth aspect of the invention. Accordingly, the power source 400, 500 or 600 previously described may be used, although other arrangements may be considered. The planar modular power distribution system has a modular planar power distribution circuit 401, 501 or 601 for example that is provided with a planar electrical cable 402, 502 or 602 having a plurality of planar insulated electrical conductors 404, 504, 604 extending therealong. The power distribution circuit 401, 501 or 601 is electrically connectable at any given location therealong to at least one planar electrical appliance 410, 510, 610 provided with a control system (not shown). The power source is further provided with a power line communication system (not shown) using a signal propagated over the planar electrical cable 402, 502 or 602 at zero-crossings for communicating with the control system of the appliance 410, 510, 610. The power line communication system may be one-way or two-way, depending on a given application. For example, a two-way power line communication system may be useful for control switching of a relay at the load or data transfer such as transfer of the resistive state of a temperature sensor of a heating panel, or any useful monitoring, as a non-limitative example and as it should be apparent to the skilled addressee.

Depending on the types of electrical appliances used in a given application, the power source may be provided with a DC source, an AC source or both. In one embodiment, the power source has a source of AC current. The power line communication system uses a modulated high frequency carrier signal propagated over the power distribution circuit at zero-crossings of a lower frequency AC.

In another embodiment, the power source has a source of DC current. In this case, the power line communication system uses a modulated high frequency carrier signal propagated over the power distribution circuit at zero-crossings of a pulse width modulated DC.

In still another embodiment, the power source has a source of DC current and the power line communication system uses a digitally modulated high frequency carrier signal propagated over the power distribution circuit.

In yet another embodiment, the power line communication system uses a low voltage and high frequency unmodulated signal propagated over the power distribution circuit at zero-crossings.

When a modulated carrier signal is used, modulation between 9 kHz to 30 MHz for example may be used. When a plurality of electrical appliances is used, the power line communication system may use a plurality of corresponding carrier signals for respectively communicating with the control system of the corresponding appliance. In this case, each of the carrier signals can be separated by at least 10 kHz to prevent cross-talk that may arise between the different carrier signals associated to each electrical appliance.

Each of the signals may be propagated along a power electrical conductor of the electrical cable, along a neutral electrical conductor of the electrical cable or along a dedicated electrical conductor of the electrical cable, as it should be apparent to the skilled addressee.

In one embodiment, the power source further comprises a wave trap or filter connected in series with the electrical conductors of the planar electrical cable for preventing high frequency carrier waves from leaving the power source.

Figure 7A:
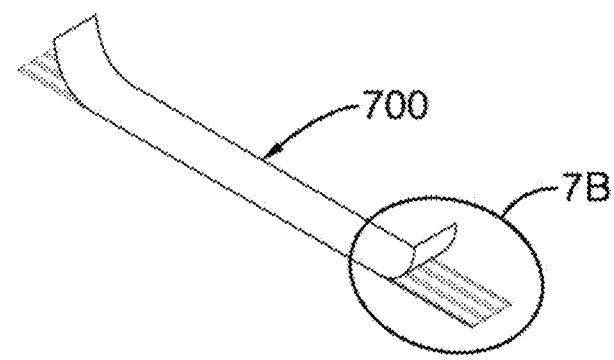
Figure 7B:
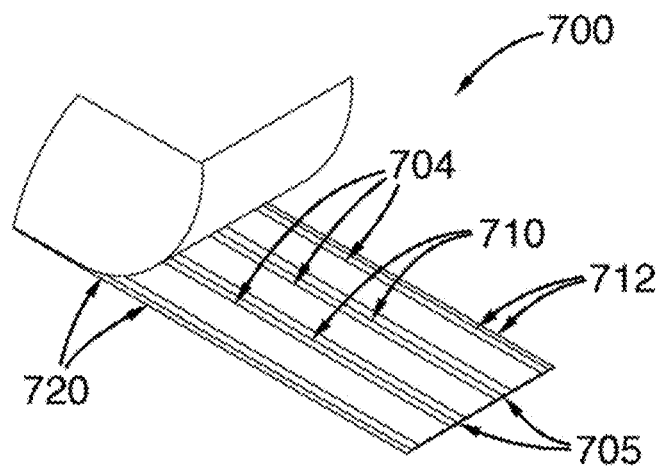
FIG. 7B is an enlarged view of portion A of FIG. 7A.

Referring now to FIGS. 7A and 7B, there is shown a planar power distribution cable 700 that can be used in the planar electrical wiring systems 100, 200, the modular power distribution systems 300 and the power sources 500, 600, 700 described above. The planar power distribution cable 700 has a plurality of planar insulated conductors 704 extending therealong and parallel to each other. The conductors 704 may provide AC current or DC current, or a combination of several AC current and DC current required for a given application, as it should be apparent to the skilled addressee. Each of the conductors 704 is separated from the adjacent ones by a clearance 710 extending axially along the length of the power distribution cable 700. Primary insulation layers 712 above and below envelope the planar conductors 704. Although a preferred embodiment uses a power distribution cable 700 with conductors 704 extending adjacent to each other for forming a planar cable 700 of reduced height, it may be considered, for a specific application, that the power distribution cable be provided with the planar conductors 704 stacked above each other. In a further embodiment, a perforated pattern 705 extending axially along the length of the cable 700 separates each adjacent planar conductor 704 and keeps them in position. A secondary insulation layer 720 may be provided above and below the primary insulation layers 712.

Figure 8:
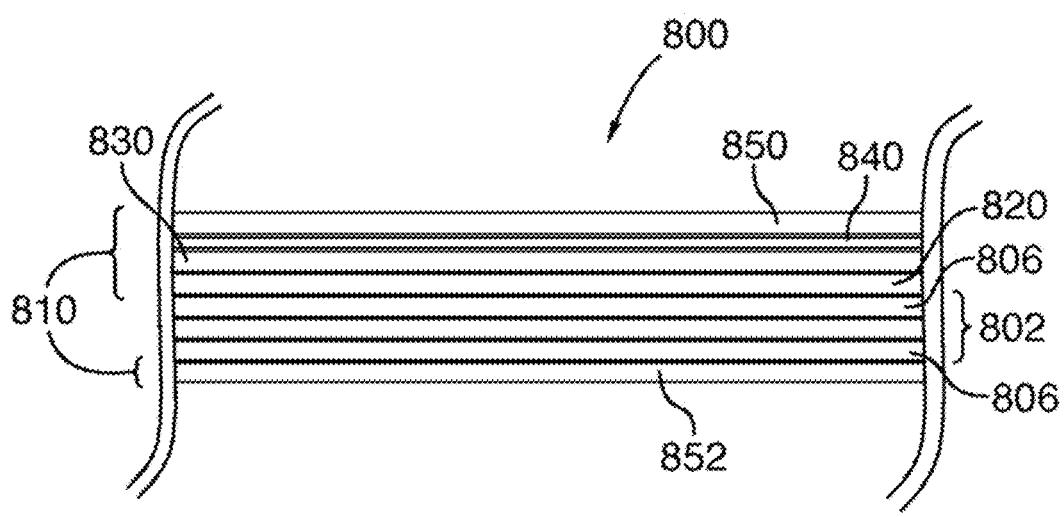
FIG. 8 is a side schematic view of an enclosure for a planar power distribution cable, according to one embodiment.

Referring now to FIG. 8, an enclosure 800 for a planar power distribution cable 802 having a primary insulation 806 will now be described, according to the fifth aspect of the invention. The planar power distribution cable 802 may be similar to the one shown in FIGS. 7A and 7B but the skilled addressee will appreciate that various other configurations of a power distribution cable may be considered for a specific application. As it should become apparent below, the enclosure 800 may be of great advantage for use with the modular planar electrical wiring systems 100, 200 or the modular power distribution system 300 described above. The enclosure 800 comprises a planar cable jacket 810 for enclosing the planar power distribution cable 802. The cable jacket 810 comprises a dielectric insulation layer 820 extending along the power distribution cable 802 and mounted on an upper portion of the primary insulation 806 of the power distribution cable 802. The cable jacket 810 also comprises an upper inner conductive covering 830 extending along the power distribution cable 802 and mounted on the dielectric insulation layer 820. The cable jacket 810 also comprises a metal foil ribbon 840 extending along the power distribution cable 802, the metal foil ribbon 840 being disposed on the upper inner conductive covering 830. The cable jacket 810 is further provided with an upper and a lower outer protective layer 850, 852 detachably attached together along side edges thereof. The upper and lower outer protective layers 850, 852 enclose the power distribution cable 802, the dielectric insulation layer 820, the upper inner conductive covering 830 and the metal foil ribbon 804 together.

In one embodiment, the upper inner conductive covering 830 has a planar metal shield. In another embodiment, the upper inner conductive covering 830 covers over about 80% of a central longitudinal region of the planar power distribution cable 802 with openings not more than 1 mm in diameter. Of course, various other arrangements may be considered, as it should be apparent to the skilled addressee. For facilitating use and installation of the power distribution cable 802 provided in the enclosure 800, the enclosure 800 can be made of flexible material, as it will be described thereinafter.

In a further embodiment, the layer construction 820, 830, 840 stacked on one side of the power distribution cable 802 may also be provided in a mirror configuration on the other side thereof, between the upper and lower outer protective layers 850, 852.

Referring now to FIG. 9A, a planar crimp connector 900 for connecting a planar electrical appliance (not shown) to a planar power distribution cable will now be described according a sixth aspect of the invention. The crimp connector 900 is provided with a first end 922 provided with an insulation-piercing crimp connection 920 for connecting at any given location along the power distribution cable according to a desired configuration. The crimp connector 900 is also provided with a second end 924 for connection to the planar electrical appliance. The crimp connector 900 has a control system 910 adapted for communicating with a power source (not shown) connected to the planar power distribution cable. In one embodiment, the control system 910 is embedded in a planar electronic board connected between the first and second ends 922, 924 of the planar crimp connector 900. In a further embodiment, the control system 910 is insulated with an insulating layer (not shown) extending thereon.

In one embodiment, the control system 910 is used for communicating one way or two ways with the power source operatively connected thereto. In one embodiment, the control system 910 may comprise a relay with AC or DC output and AC or DC current control input only for receiving a one way switching command at the zero sequence crossings. In one example, the relay comprises a low voltage AC control input and the switching command is a low voltage and high frequency signal propagated at the zero-crossings. In another embodiment, the control system 910 may communicate temperature sensor readings one way back to the power source comprising a power line communication (PLC) system. In other embodiments, the control system may also comprise a PLC system for communicating two ways back to the power source comprising a PLC system.

The length of conductors between the first and second ends 922, 924 of the planar crimp connector 900 may varied according to a specific configuration of the distribution cable to which it is crimped and of the electrical appliances connected thereto. The insulation-piercing crimp connection 920 provided on the first end 922 of the planar crimp connector 900 may also take various forms, as known to the skilled addressee. In one embodiment, as shown in FIG. 9A, the crimp connexion 920 provided at the first end 922 of the crimp connector 900 comprises a foil connector for connection to a planar conductor of the planar electrical appliance while the second end 924 is also provided with a crimp connexion 920 comprising a foil connector for connexion to the electrical appliance. Such embodiment, also called a foil-to-foil connector, is of great advantage since it enables to provide a crimp connector of a low height profile that may be used in the planar electrical wiring systems 100, 200, the modular power distribution systems 300 and the power sources 500, 600, 700 described above, or in any other electrical system where available space is reduced. As better shown in FIG. 9B to 9E, a planar connector may be arranged in various configurations, orientations and arrangements, according to a specific application, the power distribution system used and the construction of the planar appliance to be connected. In one embodiment, the foil connector of the first end 922 may be crimped on one side of the corresponding planar conductor of the power distribution cable. In another embodiment, the foil connector of the second end 924 may be crimped on one side of the corresponding planar conductor of the planar electrical appliance. In a further embodiment, the foil connector of both ends 922, 924 is crimped on both sides of the planar conductor of the planar electrical appliance and power distribution cable.

FIG. 9B to 9E show alternative embodiments of the crimp connector 900. In FIG. 9B, the second end 924 of the crimp connector 900 comprises a tab connector for connecting with a corresponding connector provided on the electrical appliance. In FIG. 9C, the second end 924 of the crimp connector 900 comprises a barrel connector for crimping with a circular wire having corresponding termination provided on the electrical appliance, as detailed below with reference to FIG. 11.

Referring now to FIGS. 9D and 9E, the crimp area as well as the angle of the crimp connexion 920 may be other than 180 degrees, such as at 360 degrees for FIG. 9D, or 90 degrees in FIG. 9E, depending on the requirements of a particular application.

FIGS. 10 to 12 show embodiments of electrical appliances 210 that can be connected to the crimp connector 900 previously described. More particularly, FIG. 10 shows a heating panel 212 provided with two planar or flat power connectors 126 made of copper or aluminum ribbon for non-limitative examples. In such an embodiment, the crimp connector 900 of FIG. 9A or 9D could be used to connect the heating panel 212 to the power distribution cable. In FIG. 11, the electrical appliance 210 is an electrical generation apparatus 218 provided with two electrical circular wires 180 acting as connectors, similar to the connectors 221 shown in FIG. 2. In such an embodiment, the crimp connector 900 of FIG. 9C could be used to connect the electrical generation apparatus 218 to the power distribution cable. In FIG. 12, the electrical appliance 210 is a lighting panel 214 provided with two rounded connectors 190 used for connexion to an electrical power distribution cable. In such an embodiment, the crimp connector 900 of FIG. 9C could be used to connect the lighting panel 214 to the power distribution cable.

Figure 13:
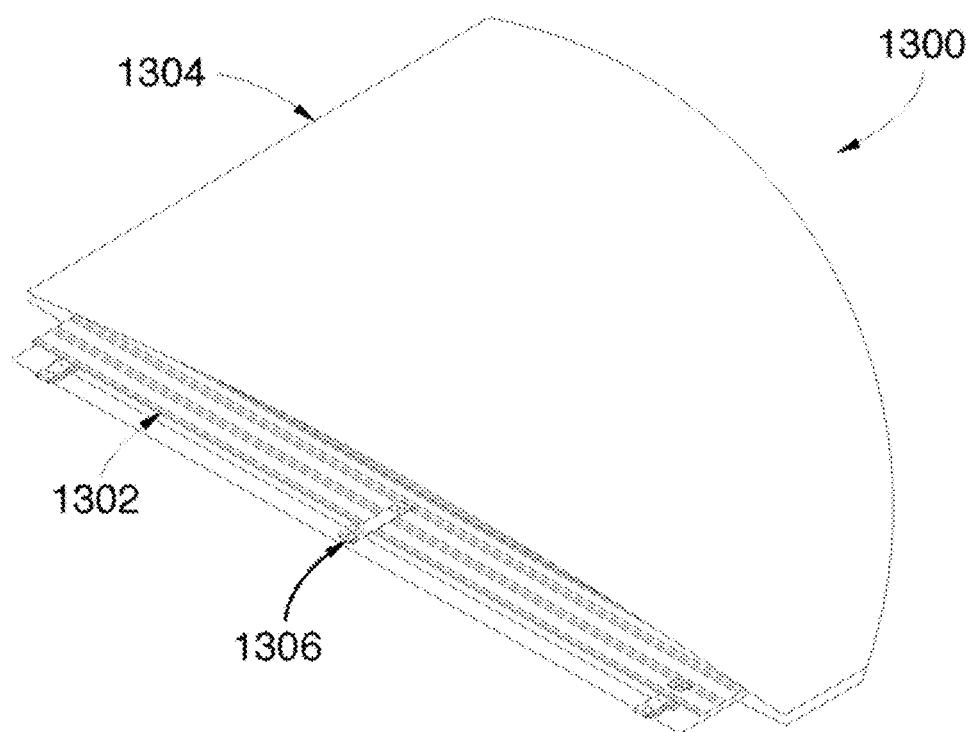
FIG. 13 is a perspective elevated view of a planar electrical wiring system with foil-to-foil crimp connection to a portable planar electrical heating apparatus, according to one embodiment.

FIG. 13 shows an embodiment of a portable planar electrical heating apparatus 1300 for outdoor snowmelt and de-icing that can take advantage of the various aspects of the invention described therein. In this illustrated heating apparatus 1300, the planar power distribution cable 1302 is internal and integrated to the apparatus 1300 and enclosed within a protective covering that may include a sheath layer 1304 crimp connected to the ground conductor 1306 of the planar power distribution cable 1302.

Figure 14:
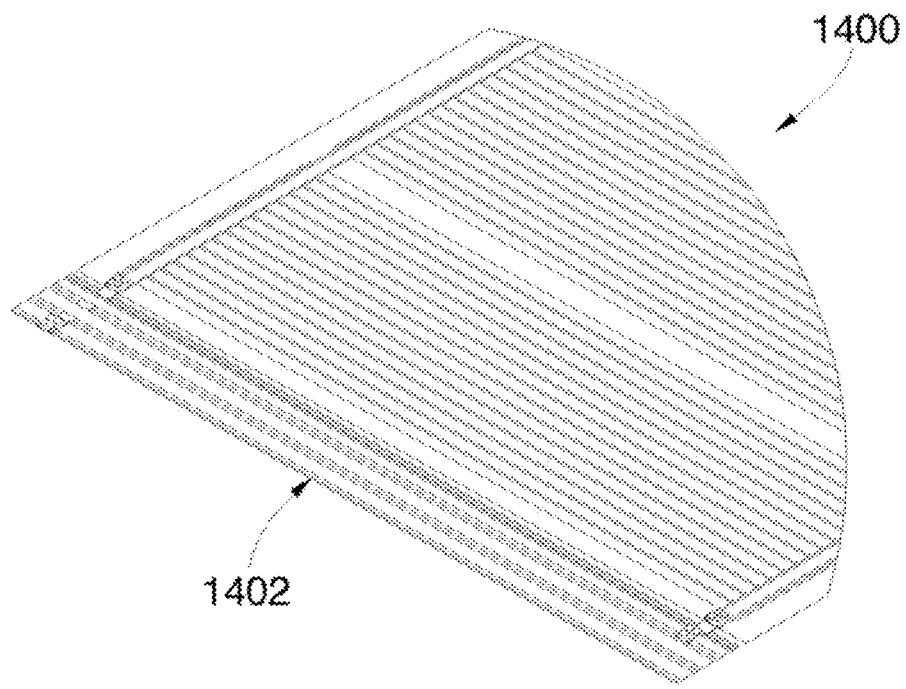
FIG. 14 is a perspective elevated view of a planar electrical wiring system connected to a planar electrical heating apparatus for underfloor heating, according to another embodiment.

FIG. 14 shows an embodiment of a fixed location planar electrical heating apparatus 1400 for underfloor heating that can take advantage of the various aspects of the invention described therein. In this illustrated heating apparatus 1400, the power distribution cable 1402 is external to the apparatus 1400. In one embodiment, the apparatus 1400 may also be connected to a sheath and ground conductor (not illustrated), as known in the art.

As it should now be apparent to the skilled addressee, the various described aspects of the present invention may be combined together according to various combinations when designing a new power installation. The power installation may be arranged in different patterns based on dimensional restrictions, electrical design considerations, and location of the terminations of the electrical appliances. The various described aspects of the present invention, alone or in combination, enable to offer a scalable and cost-effective way to manufacture and assemble a modular power distribution system. Besides, a planar electrical heating apparatus or system may be assembled and installed in a fraction of the time and at a lower cost compared to the systems of the prior art where scalability was very limited and costs to manufacture were very high.

Moreover, several aspects of the present invention may be combined together to provide a means for extending power over surfaces where fastening round or circular gauge electrical cables make it challenging to flatten the assembly in tight spaces or to mitigate tripping hazards.

Figure 15:
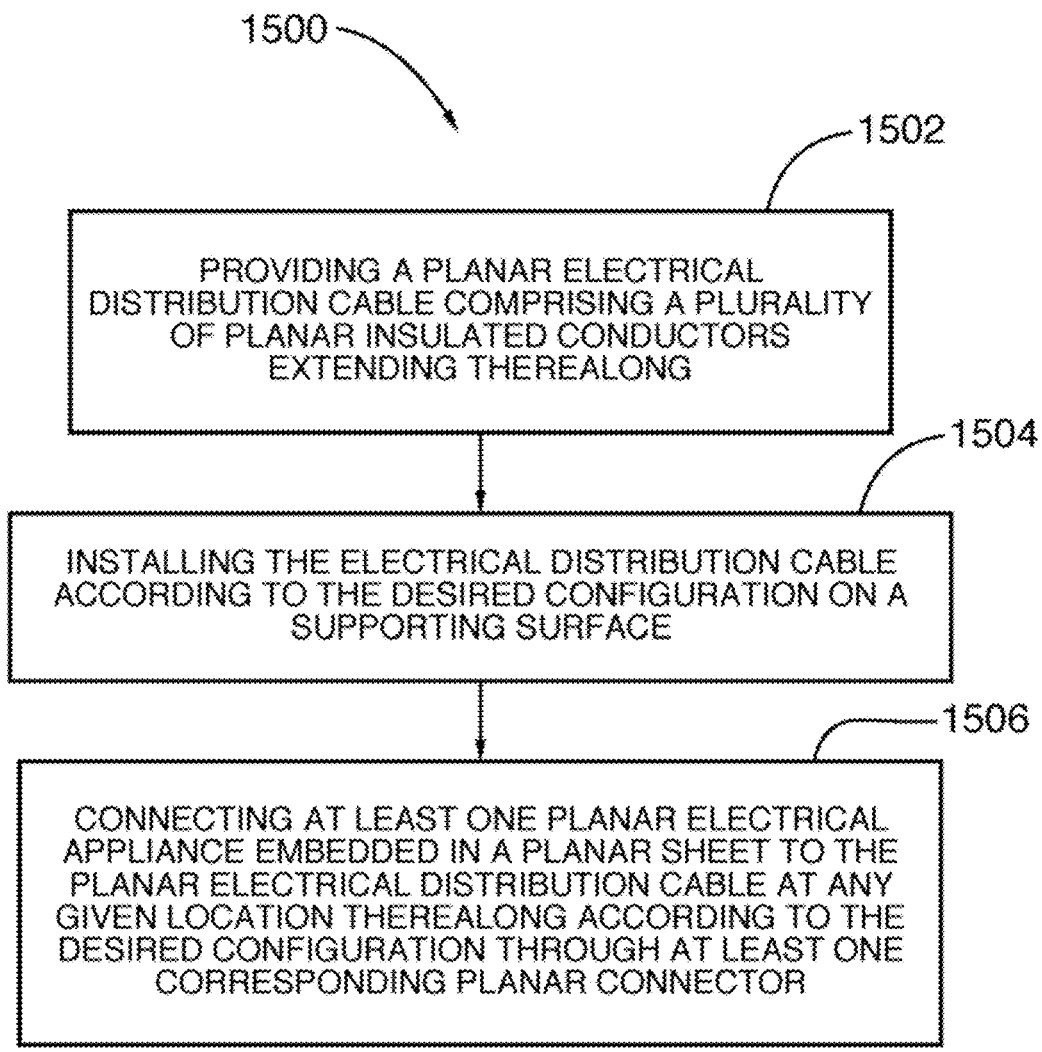
FIG. 15 is a flowchart illustrating a planar electrical wiring method for providing a planar electrical wiring according to a desired configuration, according to one embodiment.

Referring now to FIG. 15, there is illustrated a planar electrical wiring method 1500 for providing a planar electrical wiring according to a desired configuration, and according to one embodiment of the seventh aspect of the invention. At step 1502 of the electrical wiring method 1500, a planar electrical distribution cable comprising a plurality of planar insulated conductors extending therealong and parallel to each other is provided. At step 1504 of the electrical wiring method 1500, the electrical distribution cable is installed according to the desired configuration on a supporting surface. The supporting surface may be a horizontal ground surface, a ceiling or a vertical wall or panel for non-limitative examples and as more detailed below. At step 1506 of the electrical wiring method 1500, at least one planar electrical appliance embedded in a flexible sheet is connected to the planar electrical distribution cable at any given location therealong according to the desired configuration through at least one corresponding planar connector having a first end crimpable to the planar cable and a second end connectable to the appliance, to thereby provide a modular planar electrical wiring having a low height profile.

In one embodiment, a power source is operatively connected to the electrical distribution cable, as previously described. In a further embodiment, communication is established between the power source and the electrical appliance for controlling operation thereof, and the communication is performed using a signal, a carrier signal for example, propagated along the planar electrical distribution cable, as previously described.

As it should now be apparent, in operation and installation, in one embodiment, the various aspects of the present invention may be installed over wood or concrete sub-floors, under "floating" floor coverings or "fixed" floor coverings with thin-set mortar, according to any useful combination. In one embodiment, a planar electric radiant heating system may be comprised of a planar electrical wiring system crimp connected to planar electric radiant heating panels under such coverings. The planar electrical radiant heating system embedding some or all of the various aspects of the invention offers a low-profile construction and modular assembly that is cut-to-length, faster to assemble, easily scalable, more reliable, and easy to repair.

In one embodiment, the planar electrical wiring system may be comprised of 5-conductor Flat Conductor Cable (FCC) called a Flat Non-heating Cable (FNC), rated #12AWG, 300V, 20 A at 60° C., a set of insulation piercing Tap Splice Connectors rated #10/12AWG, and 2-conductor planar electric radiant heating panels rated a maximum 240V, 15 A at 60° C.

In one embodiment, the power distribution system may be comprised of a 2-phase 240VAC at 60 Hz power source for residential use with up to two branch circuits each rated 15 A, or, alternatively, a 3-phase Delta 208VAC at 60 Hz power source for commercial applications with up to three branch circuits, each rated 15 A.

Based on the available voltage and power distribution arrangement, the preferred embodiment of a 5-conductor #12AWG FNC cable may accommodate one, two or three 15 A branch circuits per zone.

In one embodiment, a Junction Box with Terminal Block Assembly may be considered the power source, crimp connected to the 5-conductor FNC cable and supplied 2-phase 240VAC or 3-phase 208VAC from a dedicated 15 A, 30 A or 45 A GFCI circuit breaker respectively at the main power distribution panel.

In another embodiment, a 5-conductor Flat Non-heating Cable (FNC) rated #12AWG, 300V, 20 A at 60° C. may be converted roll-to-roll by hot-melt laminating 5 of 9 mil thick and $^{19}/_{32}$ in. wide copper foil ribbons with 10 mil thick polyester film insulation and perforating axially along the length centered between a $^{5}/_{16}$ in. clearance between conductors. A detachably attached 10 mil thick polyvinyl chloride (PVC) protective covering may be converted roll-to-roll above and below the FNC cable as secondary electrical insulation. The FNC cable may be cut-to-length, saving time at wiring stage and being low-profile compared to conventional round wires or cables typically used.

In one embodiment, insulation piercing Tap Splice Connectors rated #$^{10}/_{12}$ AWG of the foil-to-foil insulation-piercing crimp variety may be die manufactured using 18 mil thick and 0.6 inch wide copper bus in lengths varying in multiples of $^{29}/_{32}$ in. so as to arrange crimp locations collinearly with the edge of the planar electric radiant heating panel conductors after crimp connection to the respective copper foil ribbons of the FNC cable.

In one embodiment, the planar electric radiant heating panels may be rated 240V, 15 A with 50° C. maximum temperature and may be comprised of electrically resistive conductive ink screen-printed roll-to-roll in a parallel circuit topology onto a 7.5 mil thick and 31.5 in. wide polyester film. Two $^{11}/_{16}$ in. booth bars consisting of silver ink may be printed and sintered on top of the electrically resistive ink 28.5 in. apart, extending axially along the length, and two of 7 mil thick and $^{9}/_{16}$ in. wide bare copper foil centered and converted on top of the silver ink. Finally, the assembly may be hot-melt laminated with another 7.5 mil thick protective polyester film. Electric radiant heating panels may be cut-to-length, assembled in a fraction of the time, cover greater surface areas, and are low-profile in construction compared to conventional series electric heat trace cable and hydronic pipe typically used.

In one embodiment, the parallel circuit topology of the electric radiant heating panels and an electrically parallel connection method to a FNC cable offers a reliable, lowmaintenance and sustainable alternative to series electric heat trace cable and hydronic pipe.

The system layout of the present invention may include design elements anticipated in the living space and may indicate dimensional restrictions around walls, objects and furniture above the floor.

Before installing the system, an aerial layout or floor plan may be drafted that illustrates the location of the main design components. In a preferred embodiment, the floor plan may be marked with a 8 in. wide Cable Tray along the longest unobstructed length of the space. Where FNC may be routed at a 90 degree angle, spliced, or used for series links and connections also mark a 8 in. wide Cable Tray. In one embodiment, the floor plan may be marked with 5-conductor runs of FNC cable centered within the 8 in. wide Cable Tray. Where a 90 degree angle may be required, one may route FNC cable at least 8 in. before the next 90 degree bend. In a preferred embodiment, the floor plan may be marked with heating panel locations arranged along the width of the space, perpendicular to the Cable Tray and parallel to each other for a balanced circuit topology.

In one embodiment, the floor plan may be marked with the location of a Power Source with Temperature Controller at either end of the FNC cable run for each zone. Where the Power Source with Temperature Control may be preferably spliced at another location on the main FNC cable, the various appliances to be connected may be balanced on each side. In a further embodiment, the Power Source with Temperature Control comprises a power line communication system for two-way communication with planar crimp connectors having a control system that measures temperature and switches the electric radiant heating panels on and off. In one embodiment, a Power Source with Temperature Control may be located near the power supply cable entry into the space from the main distribution panel. In one embodiment, the Power Source with Temperature Control is installed about 10 in. above the subfloor, to clear at least 2 in. above the baseboards. In one embodiment, two pieces of wood, parallel to the studs, may be used to frame and position the Power Source with Temperature Control flush with the inner surface of the drywall. In one embodiment, the Power Source may be installed before the drywall.

In one embodiment, #10/2AWG Romex cable may be routed from a dedicated GFCI (5 mA), or GFEP (15 mA), circuit breaker at the main power distribution panel through 1 of the 2 knockouts at the bottom of the Junction Box. In one embodiment, strain relief fitting may be installed to secure the cable. In another embodiment, two Romex cables may be routed for line and load, not less than 125% of the rated current, from the temperature controller through 2 of the 3 knockouts at the top of the Junction Box. In a further embodiment, PVC film may be rolled onto the subfloor. All joined sections of PVC film should preferably overlap 1.5 in. and be fastened to the subfloor with a short section of hold down tape along the edges. Use hold down tape on the edges every 10 ft. to ensure the PVC film does not shift.

In yet another embodiment, apparatus of the present invention may be rolled at the start of the FNC cable run. If starting at the Junction Box, sufficient length to terminate the cable at the Terminal Block Assembly within the Junction Box may be unrolled. Roll the cable centered along the Floor Preparation Tape to the end of the cable run or until the cable needs to change direction. For a directional change, unroll additional cable and fold by hand at a 90 degrees angle before continuing to roll the rest of the cable. Use hold down tape at the edges of the FNC cable to keep it centered and in alignment. At the end of the run, cut the cable using a scissor.

In one embodiment, T-splice connections of a main FNC cable to another FNC cable may be made at a 90 degrees angle. The top protective PVC covering of the main cable may be cut, and peeled back to access the conductors. The other FNC cable may be placed at a 90 degrees angle to the desired point of connection ⅛ in. from the edge of the main FNC cable and fastened, preferably with a short section of hold down tape along the edges. Insulation piercing Tap Splice Connectors of different lengths may be used to crimp connect the respective ribbons of the main FNC cable to the equivalent ribbon of the other FNC cable.

In one embodiment, FNC cable may be routed into the Junction Box by cutting a short section of Protective Metal Shield 6 in. longer than the distance from the subfloor to the Junction Box. Using for example a Stanley knife, an 8 in. wide opening at the base of the drywall may be cut, clearing at least 1 in. above the bottom plate of the wood framing. Preferably, a ribbon-type electrical fishing tool may be used to fish the Protective Metal Shield through an opening between the Junction Box and drywall, through the 8 in. rectangular opening at the subfloor. The terminating end of the FNC cable may be attached to the edge of the Protective Metal Shield and fished behind the drywall through the narrow opening at the Junction Box. Protective Metal Shield may then be fastened with a short section of hold down tape along the edges.

Preferably, the heating panels may be positioned at the edge of the PVC tape, and fastened or held down with tape before the heating panels have been rolled out to the desired location and cut to length. More preferably, the next heating panel may be placed ¼ in. from the edge of the adjacent panel, and rolled to desired length before cutting. Repeat until all the heating panels have been placed or positioned.

Preferably, at the non-connecting end of the heating panels, a 2 mil thick and 1.25 in. diameter polyester disc with 1.5 mil thick silicone adhesive may be placed over the copper ribbons, pressing securely to make sure it is well adhered to the polyester film of the electric radiant heating panels to prevent moisture from entering the non-heating leads. At the connecting end of the heating panels, a 1 in. incision may be made to the left of the copper non-heating leads within the 1/16 in. width of the silver booth bar region.

Where the non-heating leads of the heating panels may be aligned perpendicularly to the FNC cable ribbons, the top protective PVC covering of the FNC cable may be cut and peeled back.

Preferably, a 2 in. pocket may be torn along the perforation on the FNC cable and an insulation piercing Tap Splice Connector may be inserted and hooked onto the desired FNC cable ribbon (blue, black, green, white or red) by pressing down lightly to hold in place without piercing the insulation and foil. More preferably, insert and position the other end of the insulation piercing Tap Splice Connector between the foil and insulation layer(s) of the non-heating lead of the heating panels, and press down lightly to hold in place without piercing the insulation and foil.

In one embodiment, a Ratchet Crimping Hand Tool with flat die profile may be used to crimp the insulation piercing Tap Splice Connectors to the FNC cable and the heating panels. Seal above and below crimp connections with two Insulation Tape Sections comprised of rubber with mastic adhesive. Slide a 2 in. wide and maximum 10 in. long Insulation Tape Section between the FNC cable crimp connections and bottom protective PVC covering with rubber facing downwards. The longest edge of the Insulation Tape Section may be overlapped 2 in. onto the electric radiant heating panels, and may measure at least a 0.5 in. clearance from the edge of the Insulation Tape Section to all connections being insulated. Peel back the adhesive release liner from Insulation Tape Section and press down to adhere connections. Adhere another Insulation Tape Section above and aligned with the bottom Insulation Tape Section for a tight seal. Fold over top protective PVC covering of the FNC cable detached earlier.

In a preferred embodiment, the FNC cable may be crimp connected to a Terminal Block Assembly and the barrel terminations of the Junction Block Assembly crimp connected to the Romex cable from load side of the temperature controller.

More preferably, the Protective Metal Shield is attached at the bottom edge of the Junction Box and trimmed to remain flush with the top edge of the two tabs used for bonding. Stainless Steel Bonding Clips are inserted and the Protective Metal Shield is fastened to the Junction Box.

A dedicated GFCI (5 mA), or GFEP (max. 15 mA), circuit breaker may be installed at the main AC power distribution panel based on the rated current and leakage current characteristics. Alternatively, a Ground Fault Detector with adjustable leakage current threshold, to avoid nuisance tripping, and integral relay may be connected to the circuit breaker shunt to provide an interrupt. For 3-phase Delta 208VAC power distribution arrangements, alternative ground fault detection methods for ungrounded systems may be implemented.

In a preferred embodiment, the electric radiant heating system including planar electrical wiring system may be covered with a 4 mil thick vapor barrier exhibiting a perm rating of 0.1 or less. For "fixed" flooring systems with thin-set mortar, an anti-fracture membrane with integral vapor barrier may be used to cover the electric radiant heating system with planar electrical wiring system. The floor covering may be installed and any additional materials planned in the floor construction.

It should be noted that throughout the present description, the terms "including," "comprising" and variations thereof mean "including but not limited to," unless expressly specified otherwise. A listing of items does not imply that any or all of the items are mutually exclusive, unless expressly specified otherwise.

The present invention has been described here by way of examples only, while numerous specific details are set forth herein in order to provide a thorough understanding of the exemplary embodiments described herein. However, it will be understood by those of ordinary skill in the art that these embodiments may, in some embodiments, be practiced without these specific details. In other instances, well-known methods, procedures and components have not been described in detail so as not to obscure the description of the embodiments. Various modifications and variations may be made to these exemplary embodiments without departing from the scope of the invention. The invention in its broad aspect includes mechanical and functional equivalents of the elements described herein.

What is claimed is:

1. A modular planar electrical wiring system for providing a planar electrical wiring according to a desired configuration, the system comprising:
    a planar electrical distribution cable comprising a plurality of planar insulated conductors extending therealong and parallel to each other;
    at least one planar electrical appliance and connectable to at least two of the plurality of planar insulated conductors of the planar electrical distribution cable; and
    at least one planar connector for connecting the corresponding planar electrical appliance to a respective planar insulated conductor of the planar electrical distribution cable at any given location therealong according to the desired configuration, the planar connector having a first end connectable to the planar electrical distribution cable and a second end connectable to the planar electrical appliance, the first end receiving the respective planar insulated conductor to thereby provide a planar connection of the modular planar electrical wiring system having a low height profile.

2. The planar electrical wiring system of claim 1, wherein the at least one planar electrical appliance comprises one of: a planar heating panel, a planar lighting panel, a planar electrical generation appliance or a planar power storage device.

3. The planar electrical wiring system of claim 1, wherein the at least one planar electrical appliance comprises one of: a plurality of planar heating panels, a plurality of planar lighting panels, a plurality of planar electrical generation appliances or a plurality of planar power storage devices, each being independently connectable to the planar electrical distribution cable in a parallel relationship.

4. The planar electrical wiring system of claim 1, wherein the at least one planar electrical appliance comprises at least one load appliance and an electrical generation appliance for supplying the at least one load appliance autonomously.

5. The planar electrical wiring system of claim 1, further comprising a power source connectable to the planar electrical distribution cable.

6. The planar electrical wiring system of claim 5, wherein the power source comprises a hybrid AC and DC power source.

7. The planar electrical wiring system of claim 5, wherein the power source comprises an electrical generation appliance embedded in a planar sheet and comprising a planar power connector operatively connectable to the planar electrical distribution cable.

8. The planar electrical wiring system of claim 5, wherein the power source further comprises a power line communication system configured to communicate with a control system of the at least one electrical appliance.

9. The planar electrical wiring system of claim 8, wherein the at least one planar connector for connecting a corresponding planar electrical appliance to the planar electrical distribution cable further comprises a control system adapted for communicating with the power source, the control system being embedded in a planar electronic board connected between the first and second end of the corresponding connector.

10. The planar electrical wiring system of claim 1, further comprising at least one planar branch circuit connectable to the planar electrical distribution cable at any given location therealong according to the desired configuration through a set of planar connectors having a first and a second connectable end, the at least one electrical appliance being operatively connectable to the planar electrical distribution cable through the at least one planar branch circuit.

11. The planar electrical wiring system of claim 1, wherein the at least one planar electrical appliance comprises a lighting panel.

12. The planar electrical wiring system of claim 1, wherein the at least one planar electrical appliance comprises a planar electrical generation appliance.

13. The planar electrical wiring system of claim 1, wherein the second end of the connector comprises a planar crimp portion adapted for crimping to a planar power connector of the electrical appliance.

14. A modular power distribution system comprising:
- a planar main electrical cable comprising a plurality of planar insulated conductors extending therealong and parallel to each other;
- a power source operatively connectable to at least two of the plurality of planar insulated conductors of the planar main electrical cable;
- at least one planar branch circuit connectable to the planar main electrical cable;
- a set of planar connectors for connecting a corresponding planar branch circuit to the at least two of the plurality of planar insulated conductors of the planar main electrical cable at any given location therealong according to a desired configuration, each of the planar connectors having a first and a second end connectable to a respective planar insulated conductor of the planar main electrical cable and to the corresponding planar branch circuit respectively, the first end receiving the respective planar insulated conductor to provide a planar connection of the modular power distribution system having a low height profile; and
- at least one planar appliance connector, each having a first end connectable to one of the planar main electrical cable and the at least one planar branch circuit at any given location therealong, and a second end connectable to a planar electrical appliance.

15. The modular power distribution system of claim 14, wherein the power source comprises one of: a DC power source or an AC power source.

16. The modular power distribution system of claim 14, wherein the power source comprises a hybrid AC and DC power source.

17. The modular power distribution system of claim 14, wherein the power source comprises an electrical generation appliance embedded in a planar sheet and comprising a planar power connector connectable to one of the planar main electrical cable and the at least one planar branch circuit.

18. The modular power distribution system of claim 14, wherein the second end of the at least one planar appliance connector comprises a planar connection portion adapted for coupling to one of a planar power connector of the electrical appliance and a planar power termination of the planar electrical appliance.

19. The modular power distribution system of claim 14, wherein each of the at least one planar appliance connector further comprises a control system adapted for communicating with the power source, the control system being embedded in a planar electronic board connected between the first and second ends of the corresponding appliance connector.

20. The modular power distribution system of claim 14, wherein the power source further comprises a power line communication system configured to communicate with a control system of at least one planar electrical appliance of a plurality of planar electrical appliances.

21. The modular power distribution system of claim 14, wherein the power source comprises an AC power source.

22. A modular planar electrical wiring system for providing a planar electrical wiring according to a desired configuration, the system comprising:
- a planar electrical distribution cable comprising a plurality of planar insulated conductors extending therealong and parallel to and side-by-side with each other;
- at least one planar electrical appliance and connectable to at least two of the plurality of planar insulated conductors of the planar electrical distribution cable; and
- at least one planar connector for connecting the corresponding planar electrical appliance to a respective planar insulated conductor of the planar electrical distribution cable at any given location therealong according to the desired configuration, the planar connector having a first end connectable to the planar electrical distribution cable, the first end receiving the respective planar insulated conductor and a second end comprising a planar crimp portion adapted for crimping to a planar power connector of the electrical appliance to provide a planar connection of the modular planar electrical wiring system having a low height profile.

* * * * *